United States Patent [19]
Stowers et al.

[11] Patent Number: 5,103,378
[45] Date of Patent: Apr. 7, 1992

[54] HINGED INTERLOCKING RECEIVER FOR MAINFRAME CARD CAGE

[75] Inventors: Jeffrey P. Stowers, Waynesboro; Henri Burgers, Grottoes; Paul Blackard, Waynesboro, all of Va.

[73] Assignee: Virginia Panel Corporation, Waynesboro, Va.

[21] Appl. No.: 585,800

[22] Filed: Sep. 21, 1990

[51] Int. Cl.⁵ .............................................. H05K 7/14
[52] U.S. Cl. .................................. 361/415; 361/413; 211/41; 439/61; 439/64
[58] Field of Search ............................... 361/413–415, 361/417, 419, 420; 211/41; 439/59, 61, 62, 64

[56] References Cited

U.S. PATENT DOCUMENTS

| | | | |
|---|---|---|---|
| 3,191,097 | 8/1959 | Dano et al. | |
| 3,596,138 | 7/1971 | Lehrfeld | 361/417 X |
| 4,434,537 | 3/1984 | Bean et al. | |
| 4,498,119 | 2/1985 | Cronin | 361/415 X |
| 4,523,254 | 6/1985 | Konshak | |
| 4,602,829 | 7/1986 | DeAndrea | 361/415 X |
| 4,672,511 | 6/1987 | Meusel et al. | |
| 4,716,495 | 12/1987 | Craker | |
| 4,758,928 | 7/1988 | Wierec et al. | |
| 4,778,401 | 10/1988 | Bourdreau et al. | |
| 4,789,792 | 12/1988 | Rüedi | 361/415 X |
| 4,797,610 | 1/1989 | Fombellida | |
| 4,800,463 | 1/1989 | Ferchau et al. | |
| 4,829,402 | 5/1989 | Gewebler et al. | |
| 4,836,789 | 6/1989 | Rudy, Jr. et al. | |
| 4,893,405 | 1/1990 | Pennington | 361/415 X |

Primary Examiner—Leo P. Picard
Assistant Examiner—Paramita Ghosh
Attorney, Agent, or Firm—Lowe, Price, LeBlanc & Becker

[57] ABSTRACT

An electronic equipment enclosure includes a card cage for holding a plurality of electronic instrumentation circuit cards. Interface adapters are mounted on the front panels of each of the circuit cards to provide external connections to respective ones of the circuit cards through a connector module at the front end of each interface adapter. A pair of positioning pins are mounted on the front of each interface adapter on opposite sides of the respective connector module. A receiver is hinged to the front of the enclosure and includes upper and lower frames having a series of holes therethrough in correspondence with respective ones of the alignment pins. When the receiver is placed in an upright closed position, the alignment pins engage respective ones of the holes to accurately position the front of each adapter module and corresponding connector module which extend into a module access space between the frames. An interchangeable test adapter (ITA) includes a plurality of connectors corresponding to, and engageable with, the connector modules of the interconnect adapters. The receiver includes a mechanism for positioning the ITA on the front of the receiver over the module access space so that the connectors of the ITA engage corresponding ones of the connector modules. The ITA provides connections for interfacing the instrumentation cards to external equipment, e.g., a unit under test (UUT).

34 Claims, 19 Drawing Sheets

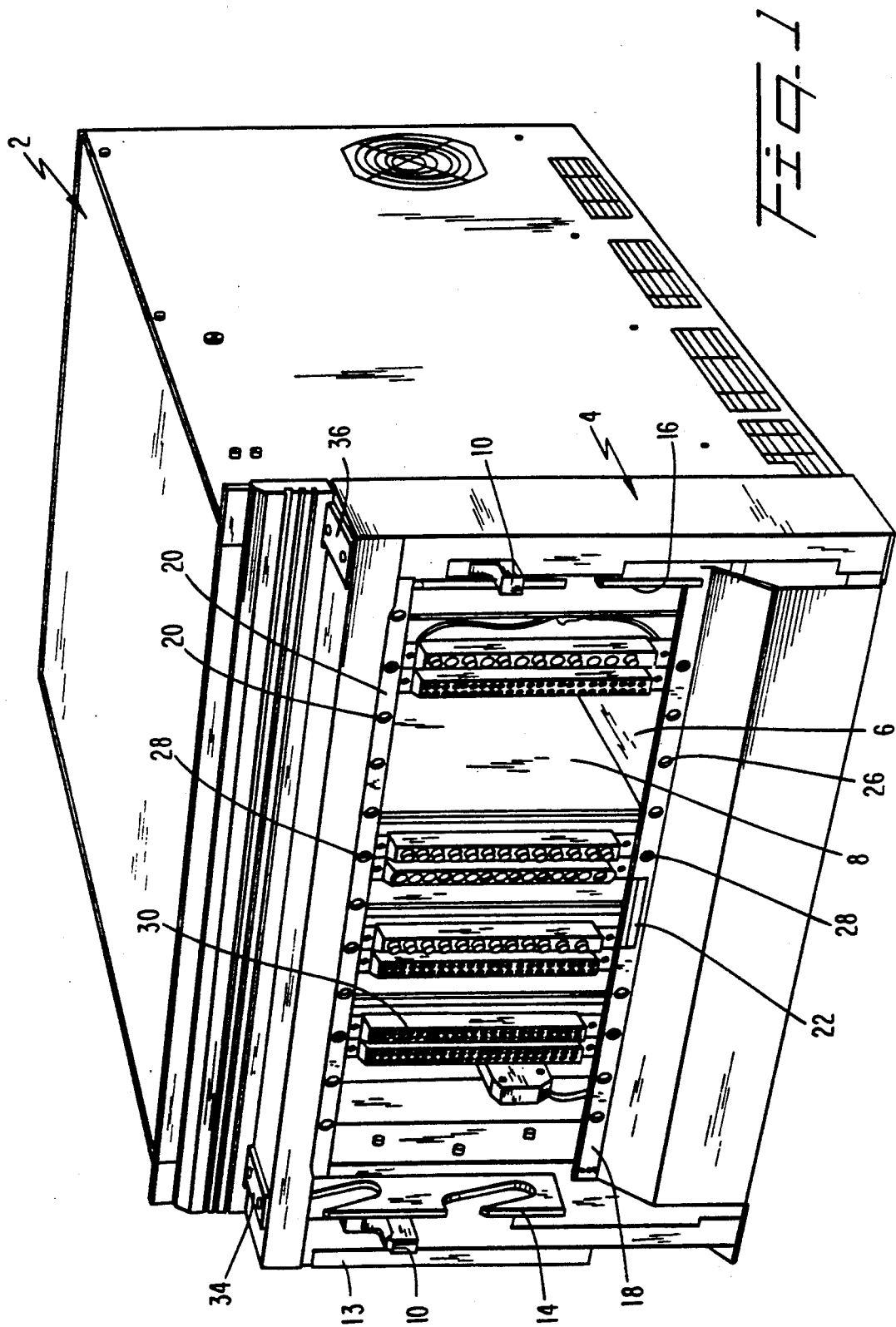

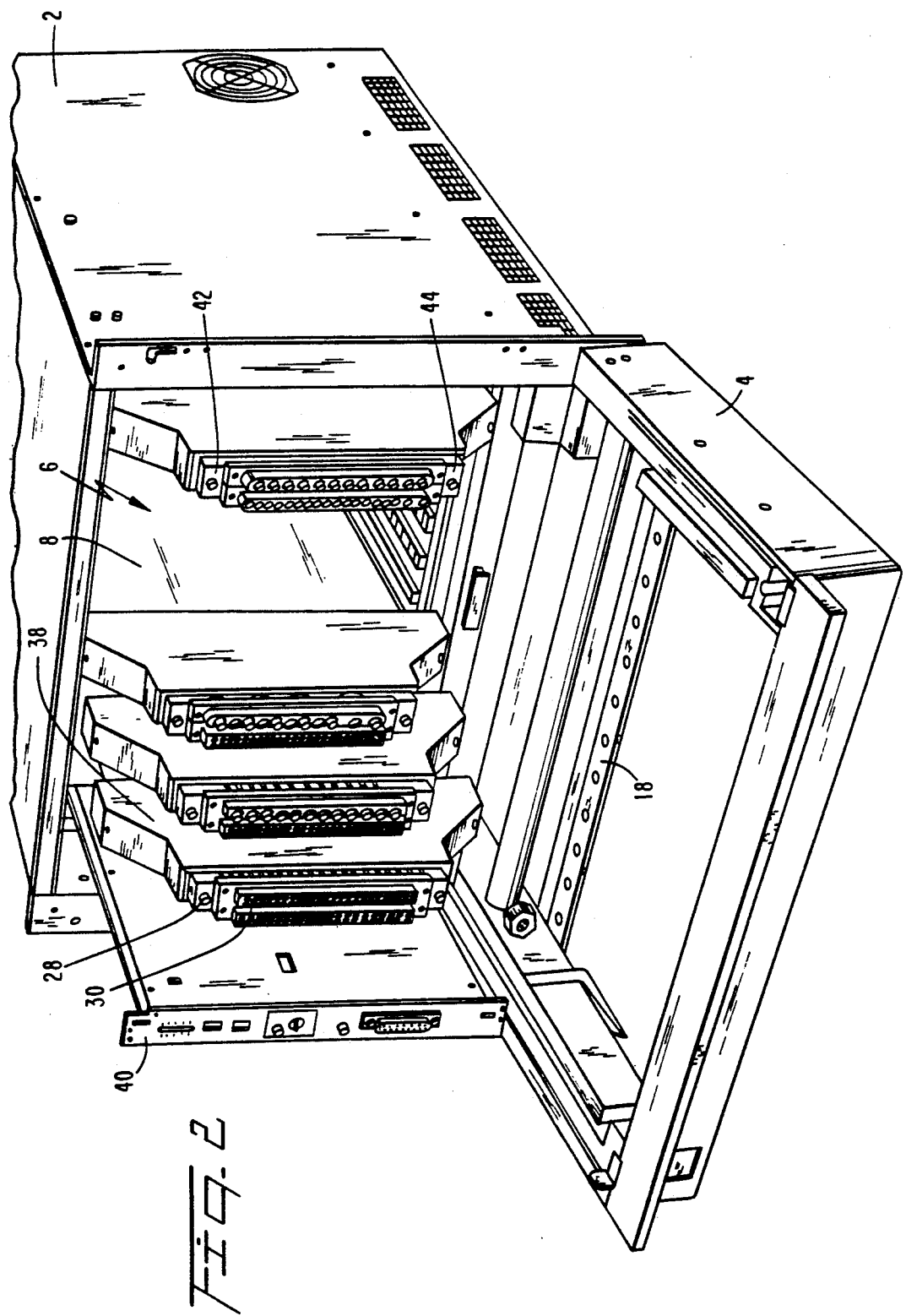

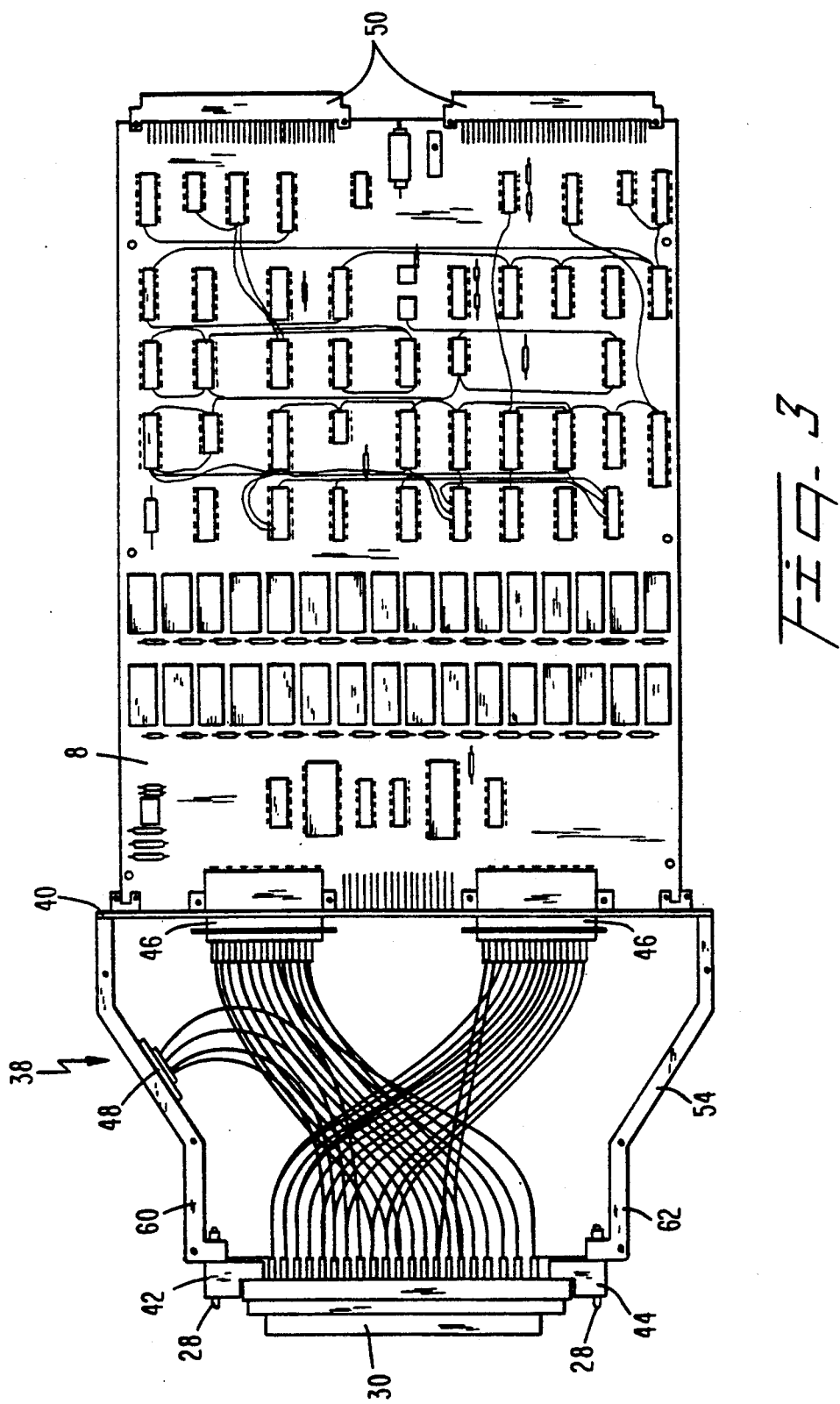

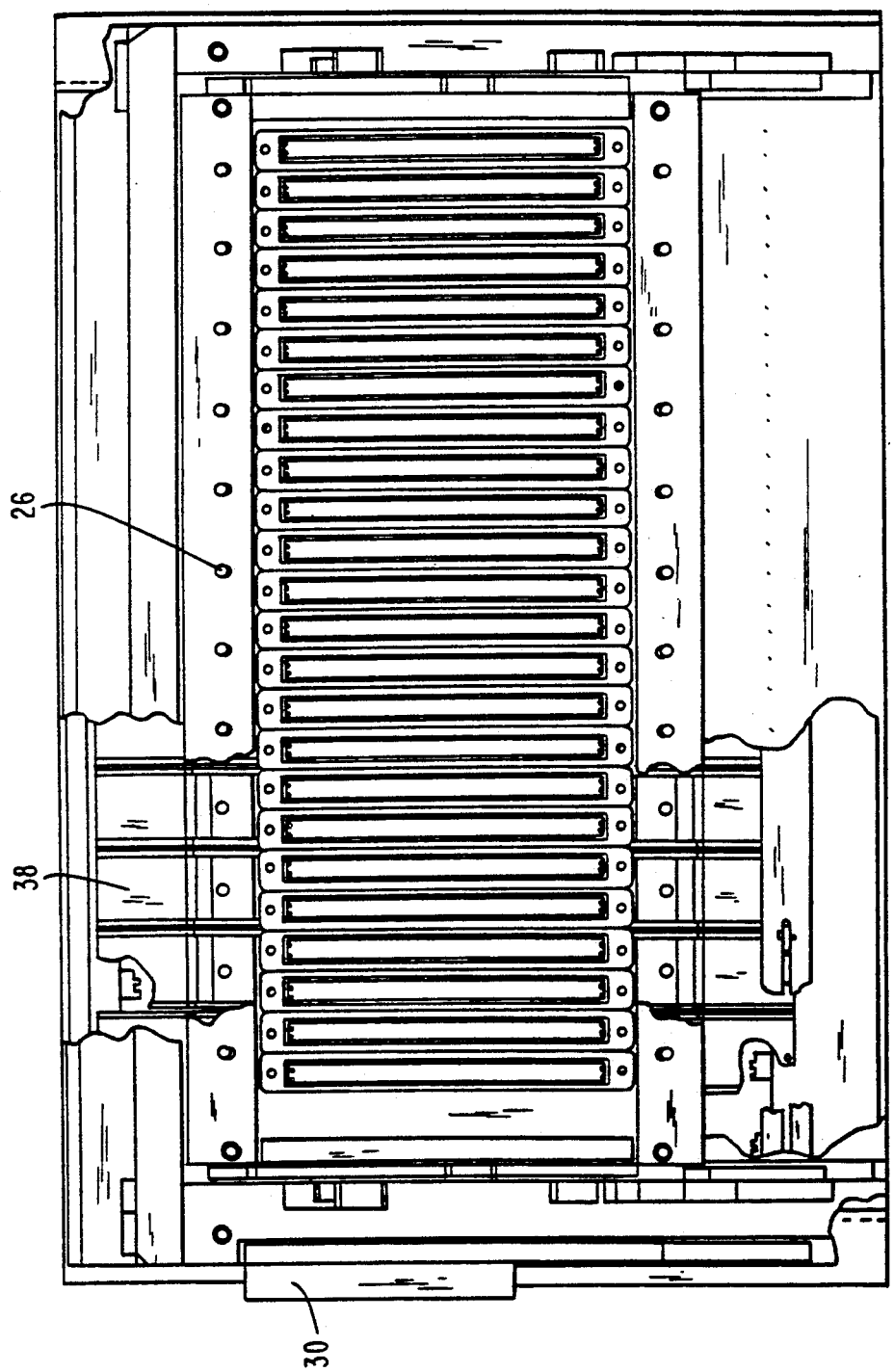

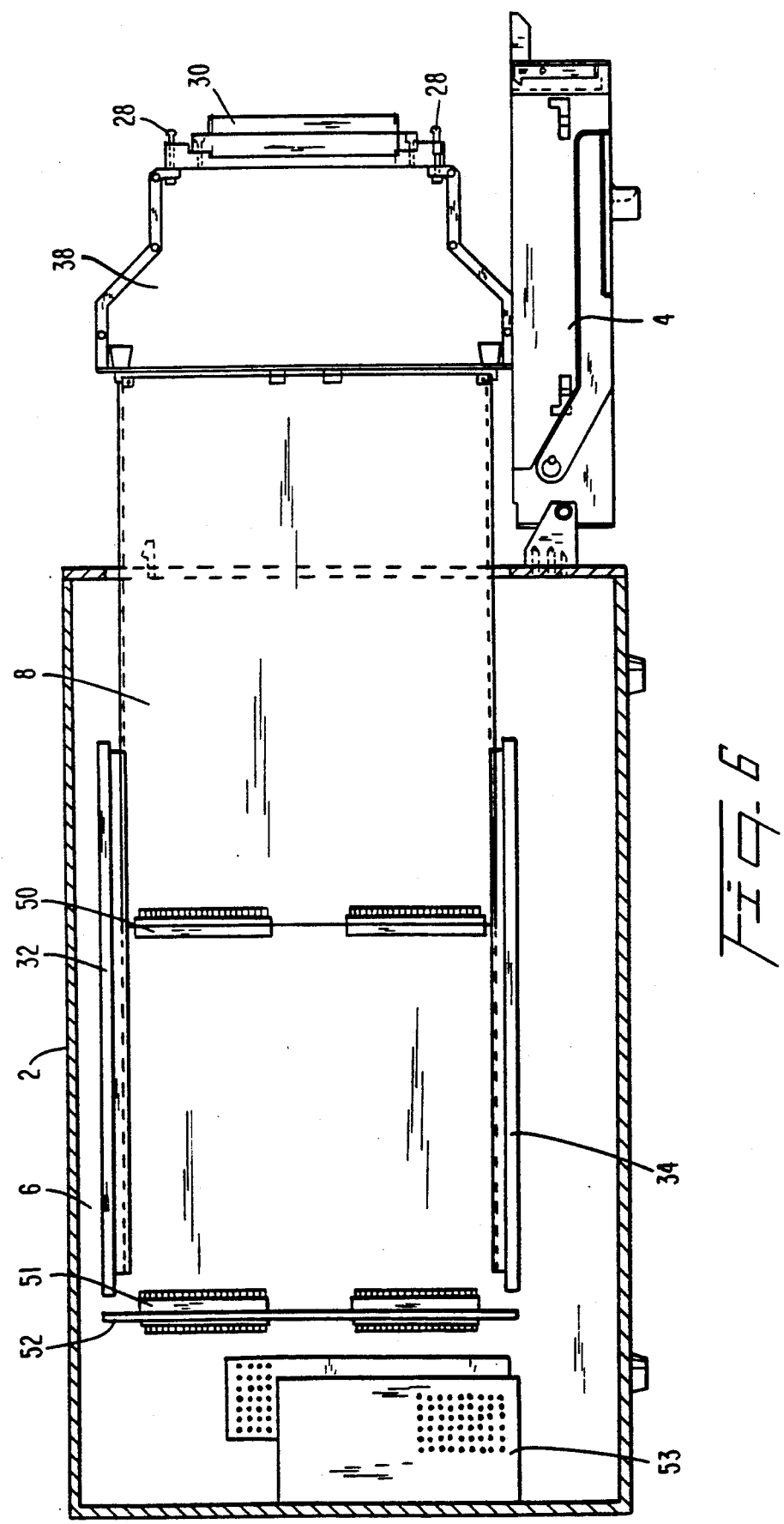

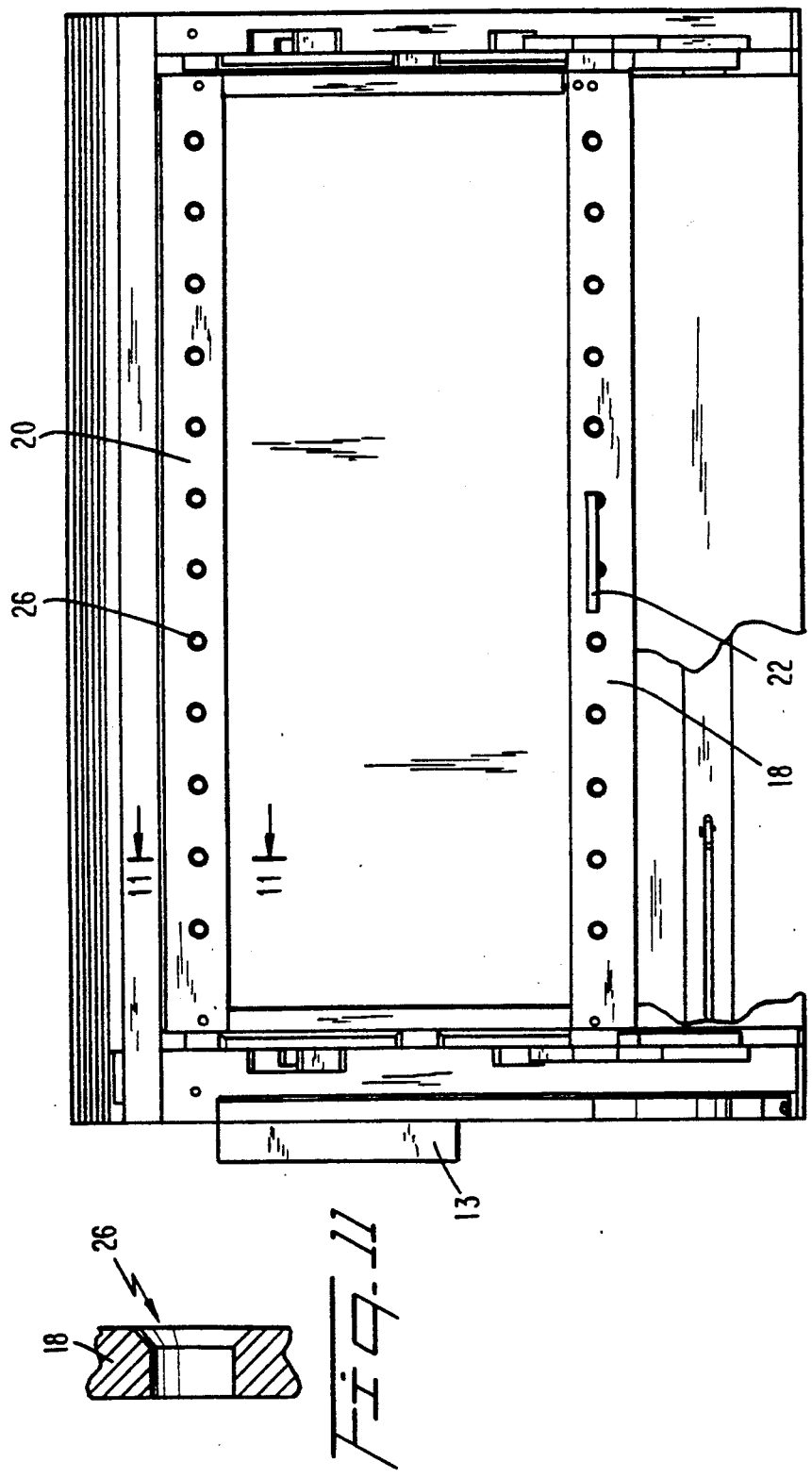

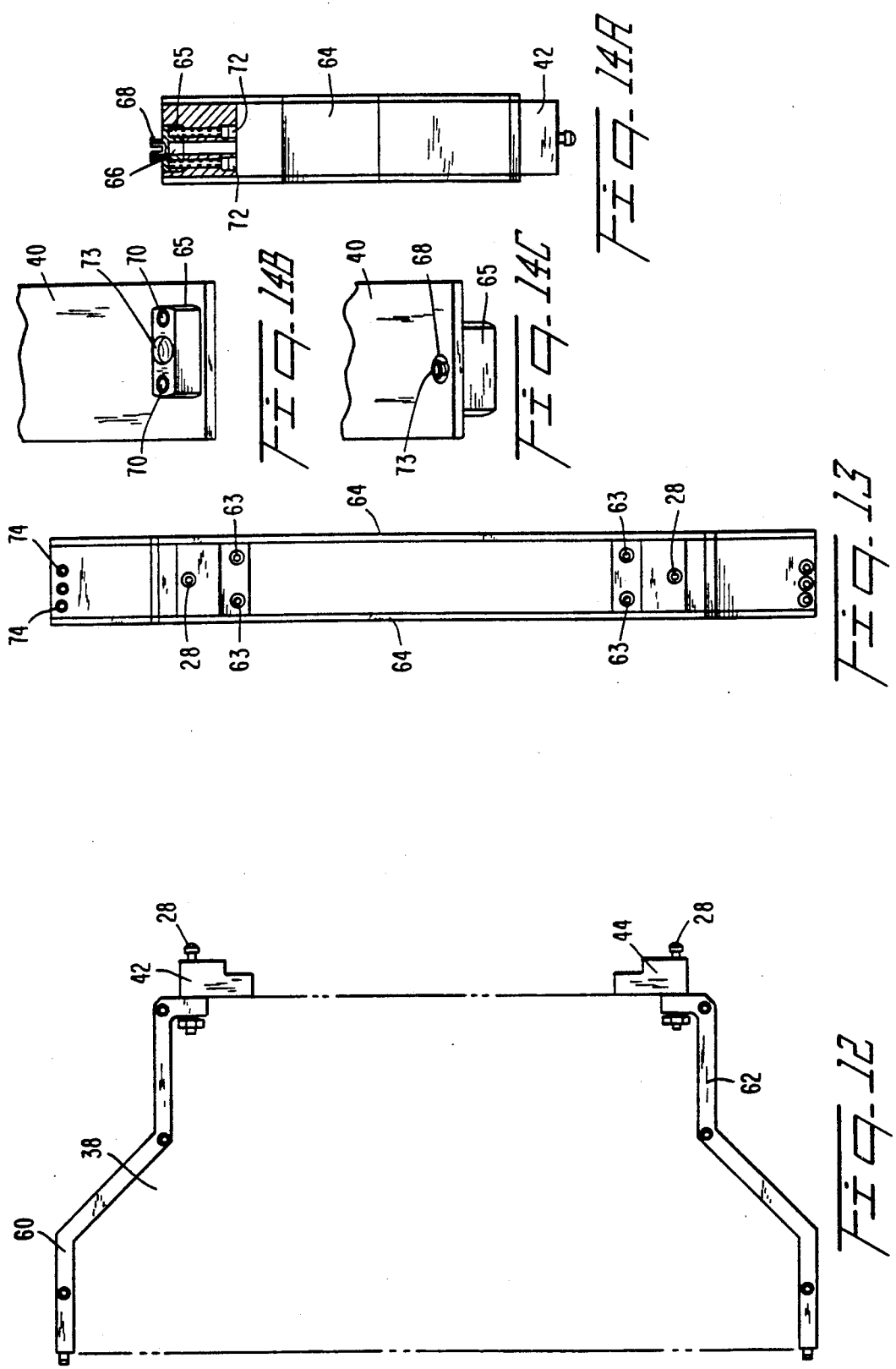

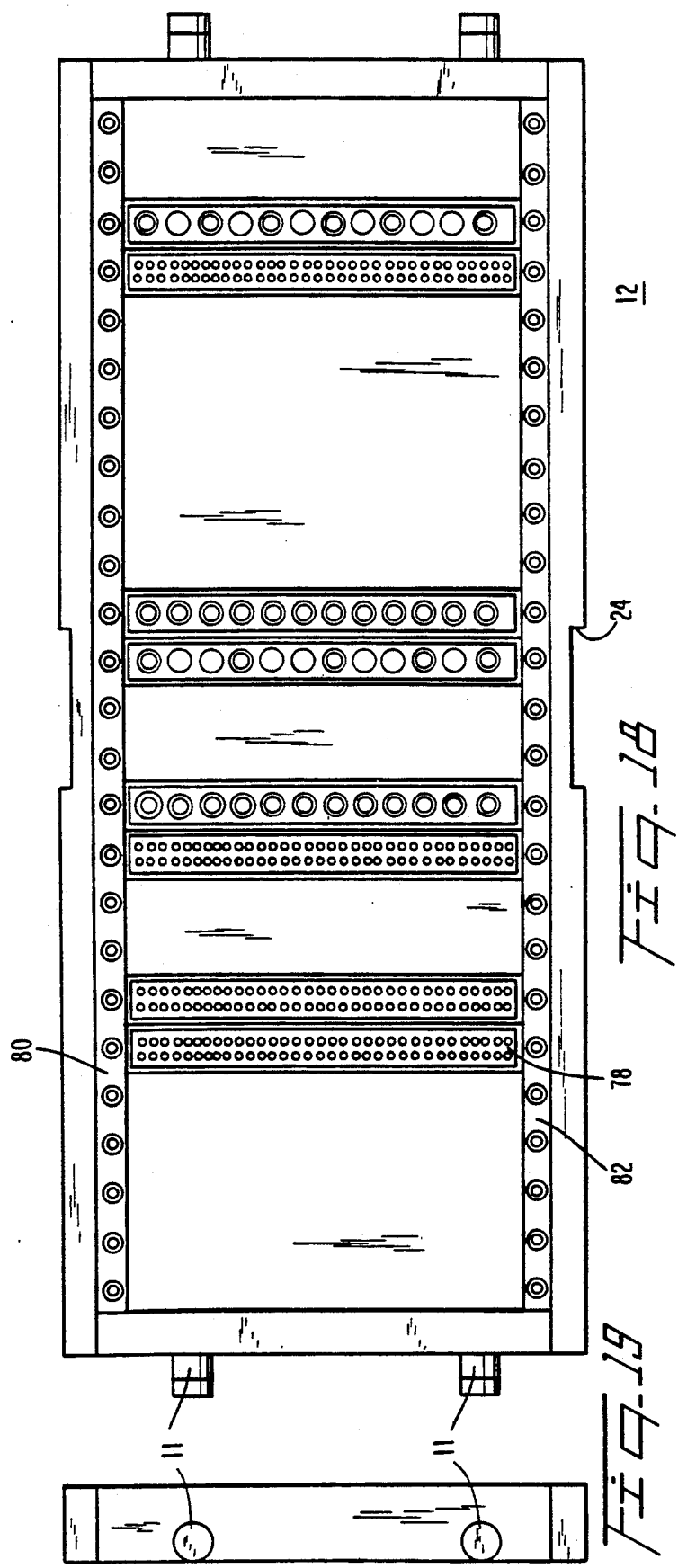

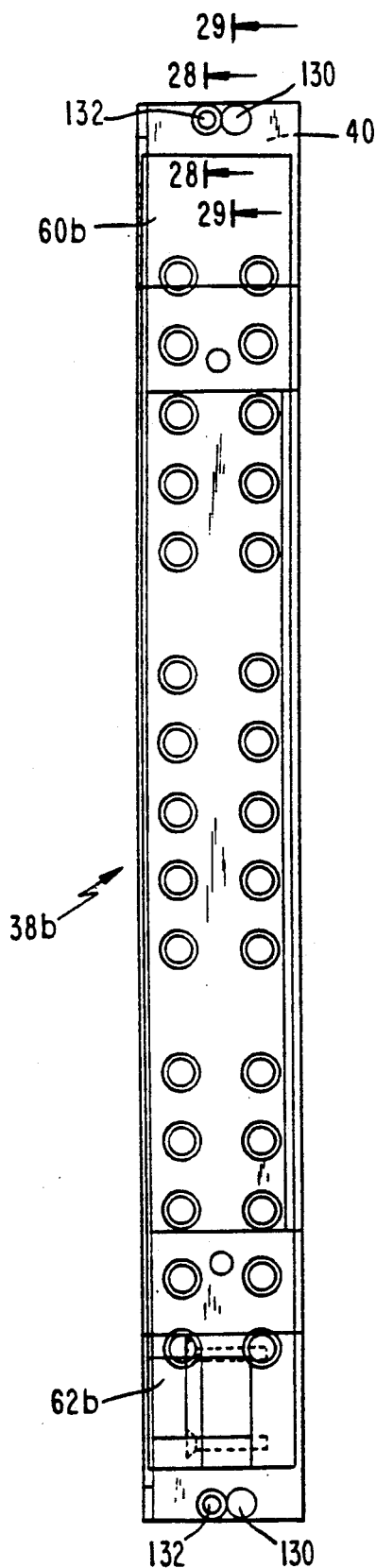
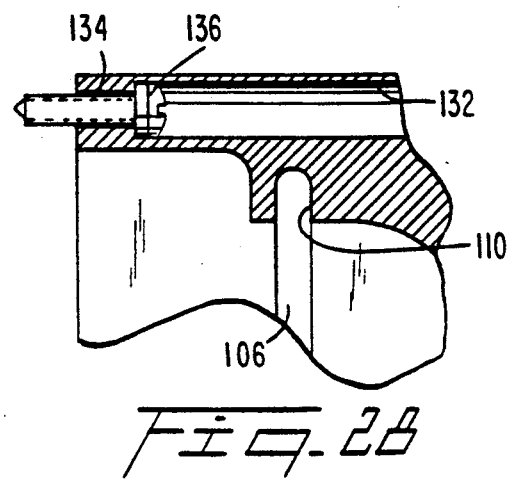
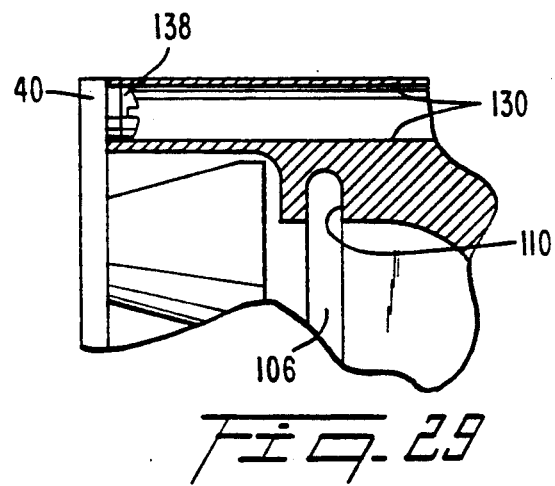

HINGED INTERLOCKING RECEIVER FOR MAINFRAME CARD CAGE

TECHNICAL FIELD

The invention relates broadly to electrical connectors and more particularly to a system for providing electrical connections to circuit boards housed mounted in a card cage.

BACKGROUND ART

The increasing complexity of modern electronic equipment has resulted in correspondingly complex test systems used to exercise and verify system performance of a unit under test (UUT). To accommodate the many different types of electronic systems to be tested, test equipment is built using a modular architecture. Commercially available standard and custom instrumentation modules are built on standard sized circuit boards which are combined to form a reconfigurable test system adaptable to perform specialized testing of a UUT.

The individual instrumentation cards constituting the testing system are mounted in a common card cage which provides mechanical support and electrical connections between the instrumentation cards. A rear end of each instrumentation card has signal input/output and power terminals which slide into and engage an edge connector located on a mother board mounted at the rear of the card cage.

A metal panel is mounted on the front of each instrumentation card and includes connectors for interfacing the instrumentation card to a UUT. Each instrumentation card is attached via a suitable connector either directly to a corresponding connector on the UUT or to an interface or break out box. An interface box is used to provide appropriate interconnections, testing configurations and connectors for interfacing the test system to a specific UUT. The interface box may include patching facilities to configure the various test signal input/output terminals for a specific UUT and to provide suitable connector pin-out configurations adapted for a specific UUT configuration.

The instrumentation cards are loosely held in the card cage by slides at top and bottom edges of each card. Providing a limited amount of play in mounting the circuit cards facilitates insertion of the rear edge connector of the card into the mother board and accommodates slight card positioning misalignment. Difficulty in aligning the instrumentation cards is compounded by variations between cards as a result of normal manufacturing tolerances in construction of the card, the front panel and the front connectors. As a result, the front connectors of the instrumentation cards are not precisely aligned within the card cage so that a single integrated connector cannot provide electrical connections to all the instrumentation cards. Instead, each electrical connector attaching a corresponding cable to an instrumentation card must be individually engaged with the corresponding card panel connector. Providing individual connections to each of the instrumentation cards is time consuming, error prone and increases wear to the connector.

Prior art systems which need a separate interface or break-out box to adapt the outputs from the individual instrumentation cards to a particular UUT require extra cabling and connectors between the test system and the interface box. Reconfiguring the interface box for a specific UUT configuration becomes time consuming and error prone.

The instrumentation cards used in a testing system are commercially available from a variety of vendors using industry standard circuit board sizes, rear edge pin configuration to interface with a mother board and standard front panel sizes and mounting screw placement. However, card cage depths are not standardized so that differing card cage manufacturers provide different set back distances measured from the front edge of the card cage to the front panels of the instrumentation cards. It is therefore difficult to manufacture a universal connector for attaching signal lines to the instrumentation modules. Further, to avoid damage to expensive instrumentation cards, modifications to the cards are to be avoided.

Accordingly, it is an object of the invention to provide a system for interfacing a unit under test to instrumentation and related circuit cards mounted in a card cage.

Another object of the invention is reduce the number of manual steps required to connect several card cage mounted circuit cards to a UUT.

Still another object of the invention is to eliminate intermediate jumper cables between a test system and a junction box.

A further object of the invention is provide an interchangeable input/output connector configuration capability for a test system.

DISCLOSURE OF THE INVENTION

According to one aspect of the invention, a system for housing circuit boards in a card cage includes at least one circuit card having mounted thereon an interconnect adapter and a receiver mounted on the front of the card cage. The interconnect adapter includes attachment elements for mounting a rear end thereof onto the front panel of the circuit card. A connector panel, recessed within the interconnect adapter, has one or more interface connectors mounted therein which engage corresponding connectors mounted on the front panel of the circuit card. The front end of the interconnect adapter includes a connector module which is electrically connected to the circuit card for providing an electrical interface between the circuit card and external equipment. The receiver has a module access space into which the connector module extends when the receiver is in a closed position.

Positioning elements are provided on the front end of the interconnect adapter for aligning the connector module. The receiver includes alignment elements which engage the positioning elements of the interface adapter thereby aligning the connector module.

The positioning elements can comprise a pair of alignment pins located at the top and bottom of the interconnect adapter on either side of the connector module. The alignment elements typically comprise a plurality of chamfered apertures in an inner frame portion of the receiver for engaging the alignment pins. The receiver can be hinged onto the card cage so that it can be positioned in an open position for removing and inserting the circuit card into the card cage and in the closed position wherein the apertures engage the alignment pins of the interface adapter thereby positioning the connector module into a predetermined interconnect position.

The attachment elements can include an adapter including a main body having a width equal to or less than the width of the circuit card front panel. The adapter include a central void for accepting a bolt engageable with a card mounting rail of the card cage. The bolt passes through the central void in the adapter and through a mounting hole in the front panel of the circuit card to engage the card mounting rail so that the front panel of the circuit card is secured between the adapter and the mounting rail. Threaded voids are located on opposite sides of the central void of the mounting adapter for receiving bolts that attach the rear end of the interconnect adapter to the mounting adapter. Alternatively, the mating of the interface connectors with the circuit card front panel connectors may provide sufficient mechanical connectors between the interface adapter and circuit card so that no further attachment elements are required.

According to another aspect of the invention an interchangeable test adapter (ITA) is mountable on the receiver substantially covering the module access space in the receiver. The ITA has one or more connectors facing outward from one side thereof, the connectors aligned to engage corresponding module connectors. The receiver includes hangers for supporting and positioning the ITA with respect to the connector module(s) so that the ITA connector operatively engages the module connector.

Still other objects and advantages of the present invention will become readily apparent to those skilled in this art from the following detailed description, wherein only the preferred embodiment of the invention is shown and described, simply by way of illustration of the best mode contemplated of carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF DRAWINGS

FIG. 1 is a perspective view of an equipment enclosure including a card cage and a hinged receiver in the closed position.

FIG. 2 is a perspective view of the equipment enclosure of FIG. 1 with the receiver in the open position and several of the instrumentation cards partially removed.

FIG. 3 is a side view of a typical instrumentation circuit card with an interconnect adapter installed.

FIG. 4 is a front view of the equipment enclosure of FIG. 1 with all instrumentation card slots filled.

FIG. 5D is a partial left sectional view of the equipment cabinet of FIG. 1 with the receiver partially open.

FIG. 6 is a left sectional view of the equipment cabinet of FIG. 1 with the receiver in the fully opened position and an instrumentation card partially inserted into the card cage.

FIG. 7 is a front view of the equipment cabinet of FIG. 1 showing details of the inner frame assembly.

FIG. 11 is a sectional view of the receiver inner frame assembly guide holes.

FIG. 12 is a left side view of an interconnect adapter including module mounting blocks and module alignment pins.

FIG. 13 is a front view of the interconnect adapter of FIG. 12 showing mounting holes for attaching a connector module.

FIG. 14A is a top view of the interconnect adapter of FIG. 12 showing adapter side covers.

FIG. 14B is a perspective view of a mounting adapter mounted on the front panel of an instrumentation card.

FIG. 14C is a rear perspective view of a mounting adapter inserted through a mounting hole in the front panel of an instrumentation card.

FIG. 18 is a back view of an Interchangeable Test Adapter (ITA).

FIG. 19 is a left side view of an ITA.

FIG. 27 is a partial section front view of the interconnect adapter of FIG. 26 mounted on the front panel of an instrumentation card.

FIG. 28 is a sectional side view of the walls of an interconnect adapter with a mounting hole for mounting the interconnect adapter and the instrumentation card to a card cage.

FIG. 29 is a sectional side view of the walls of an interconnect adapter with a mounting hole for accommodating the head of an instrumentation card mounting screw.

BEST MODE FOR CARRYING OUT THE INVENTION

Figure 5A:
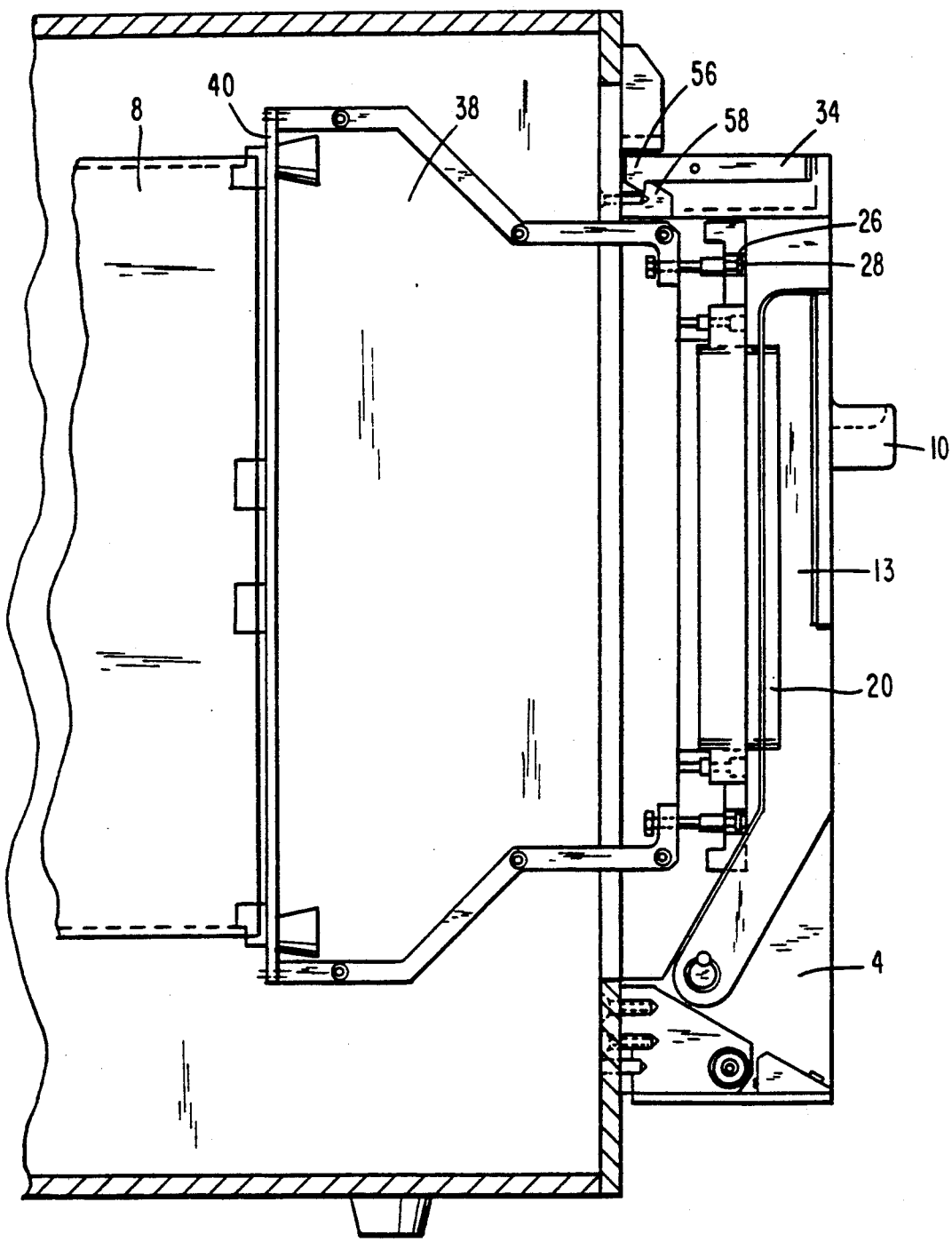
FIG. 5A is a partial left side sectional view of the equipment cabinet of FIG. 1 showing an interconnect adapter engaging upper and lower inner frames on the receiver.
Figure 5B:
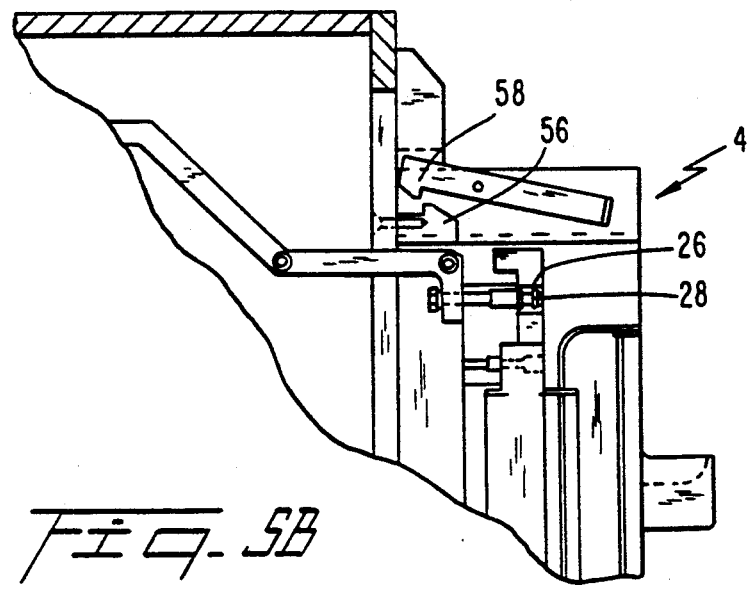
FIG. 5B is a partial left sectional view of the equipment cabinet of FIG. 1 showing details of the receiver latch mechanism with the receiver closed.

In accordance with the unique features set forth more fully below, there is provided an electronic equipment enclosure including a card cage for holding a plurality of electronic instrumentation circuit cards. Interface adapters are mounted on the front panels of each of the circuit cards to provide external connections to respective ones of the circuit cards through a connector module at the front end of each interface adapter. A pair of positioning pins are mounted on the front of each interface adapter on opposite sides of the respective connector module. A receiver is hinged to the front of the enclosure and includes a upper and lower frames having a series of holes therethrough in correspondence with respective ones of the alignment pins. When the receiver is placed in an upright closed position, the alignment pins engage respective ones of the holes to accurately position the front of each adapter module and corresponding connector module which extend into a module access space between the frames.

An interchangeable test adapter (ITA) includes a plurality of connectors corresponding to, and engageable with, the connector modules of the interconnect adapters. The receiver includes a mechanism for positioning the ITA on the front of the receiver over the module access space so that the connectors of the ITA engage corresponding ones of the connector modules. The ITA provides connections for interfacing the instrumentation cards to external equipment, e.g., a unit under test (UUT).

FIG. 1 is an illustration of an electronic equipment cabinet 2 with a hinged interlocking receiver 4 in the closed position and includes a card cage 6. Receiver 4 has an outer frame portion including vertical side supports and upper and lower horizontal members extending between the vertical side supports. The inner portions of the horizontal members terminate in a inner frame assembly including top and bottom horizontal inner frame bars 18 and 20. Moveable mounting slides 14 and 16 are located on the inner surfaces of the vertical portions of the frame. The area between inner frame bars 18 and 20 and slides 14 and 16 defines a module access space.

Commercially available card cages are available for holding up to twenty-four standard C size instrumentation circuit cards 8 at a spacing of 0.600 inch centers or twelve double width modules at a spacing of 1.200 inch centers as shown. As shown in FIG. 1, the cards are vertically mounted in parallel within cage 6.

L shaped hangers 10, also referred to as vertical locators, are located on opposite sides of receiver 4 near the top of the receiver. An arm portion of the hangers protrude horizontally outward from the face of the receiver and include a channel opening upward and inward. The channels accept and guide corresponding upper vertical rollers/locators 11 located on either end of an ITA 12 (FIG. 18) into position.

Handle 13 is located on the left side of the receiver and is positionable in a closed position wherein the handle is aligned with the receiver and in an open position wherein the handle is rotated to a lowered position relative to the receiver. Handle 13 is attached to left and right slides 14 and 16 by a mechanical linkage. The slides are located on opposite side portions of the receiver, immediately inside of hangers 10.

Each slide is a vertically oriented metal bar including a pair of parallel slots opened at the front of each bar, angled down and toward the back of the bar. The slots terminate at a position down and to the rear of each bar so that the openings and terminal ends are spaced to coincide with the spacing of the rollers/locators 11 of the ITA. (See FIGS. 18 and 19.)

When handle 13 is in the lowered position, left and right slides 14 and 16 are lowered so that the upper and lower rollers 11 of an ITA are engaged by the slots formed in the slides. Rotating handle 13 into the vertical position raises slides 14 and 16, drawing ITA 12 horizontally rearward along hangers 10 into position against the inner frame of the receiver.

Horizontal locator 22 is a small horizontal metal tab protruding from the center portion of inner frame bottom bar 18. Horizontal locating groove 24 (FIG. 18) on the bottom of the ITA 12 engages horizontal locator 22 to provide lateral alignment of the ITA 12 with respect to the receiver. Smooth rearward movement of ITA 12 toward the card cage is necessary so that the ITA connectors properly engage corresponding instrumentation card connector modules which extend through the receiver. Slight misalignment of the connectors or connector modules can damage to the connectors.

A series of alignment holes 26 are chamfered at the rear thereof (FIG. 11) and are positioned at the center of each instrumentation circuit card location, along the length of top and bottom bars 18 and 20. Alignment pins 28 provided at both ends of connector modules 30 are engaged by corresponding alignment holes 26 to precisely position the connector modules.

Connector modules 30 are attached to the front end of respective circuit cards 8 and provide appropriate electrical interfaces to the cards. The connector modules are vertically oriented to extend into the module access space and are located so that the center of each interface module is aligned with an inner frame bar alignment hole. Each connector module includes a plurality of individual connectors of a type or types adapted to supply signal types appropriate to the respective circuit card. Typical connector modules include a single or an adjacent pair of molded plastic multi-pin connectors. Each connector of a multi-pin connector is configured appropriate to the signal type including low level signal pin connectors, power connectors and coax connectors.

Upper and lower card guide rails 32 and 34 of the card cage (FIG. 16) are generally U shaped, of a shape and size to include a predetermined small amount of play between the outer surfaces of the card 8 and the adjacent inner surface of the rail. The flexibility of the card itself in combination with the predetermined tolerance provided by the selected dimensions of the rail member permit a small play or relative motion between them without binding the card. The small amount of play permits a repositioning of the connector module located at the front of the card upon engagement of the alignment pins 28 in alignment holes 26.

Latch release buttons 36 are located at the top of the receiver frame and permit hinged interlocking receiver 4 to be lowered into an opened position for installation and removal of instrumentations cards 8 into and out of card cage 6. FIG. 2 shows hinged interlocking receiver 4 lowered with instrumentation cards 8 partially inserted into card cage 6. Alignment pins 28 are located at the top and bottom of each interconnect adapter 38, on both sides of connector module 30. Interconnect adapter 38 is shown mounted to the front panels of all but the left-most instrumentation card. The rear end of interconnect adapter 38 coincides in size to, and is mounted on, a front panel 40 of the instrumentation card. Interconnect adapter 38 tapers from the rear end where it is mounted on front panel 40 to its forward end so that connector modules 30 extend through the module access space between frame bars 18 and 20. When hinged interlocking receiver 4 is in the upright closed position, upper and lower pin mounting blocks 42 and 44 are located behind inner frame top and bottom bars 20 and 18, respectively, while alignment pins extend into alignment holes 26 and connector module 30 extends between the inner frame bars.

FIG. 3 is an illustration of interconnect adapter 38 with its side panels removed to show internal wiring between connector module 30 and multipin D-shell connectors 46 mounted on front panel 40 of instrumentation card 8. Connections are also shown to an auxiliary connector 48. Adapter top and bottom walls 60 and 62 have a substantially rectangular cross section with rear and front horizontal sections connected by a sloped middle section. The front portions of the walls terminate in inwardly projecting ends. The rear portions of the walls are attached at upper and lower ends of panel 40 of circuit card 8. The inwardly projecting ends of the walls provide a surface for mounting thereon upper and lower pin mounting blocks 42 and 44 with connector module 30 mounted on and between the blocks. Module 30 has includes a plurality of electrical connectors accessible from outside of the interconnect adapter and terminals projecting into the interconnection adapter wired to connectors located at the rear of the interconnection adapter.

Card cage interface connectors 50 are located at the rear of instrumentation card 8 for engaging connectors 51 located on mother board 52 (FIG. 6) at the rear of the enclosure. Upper and lower pin mounting blocks 42 and 44 can be loosely attached to the front of interconnect adapter frame 54 to provide additional play so that connector module 30 can be positioned by alignment pins 28 upon engaging alignment holes 26. Alignment pins 28 may be tapered to facilitate insertion into alignment holes 26.

Card cage 6 is shown in FIG. 4 with twelve instrumentation cards with interconnection adapters installed. Handle 13 is coupled to an adjustable handle shaft which is connected to move left and right slides 14 and 16 up and down.

Figure 5C:
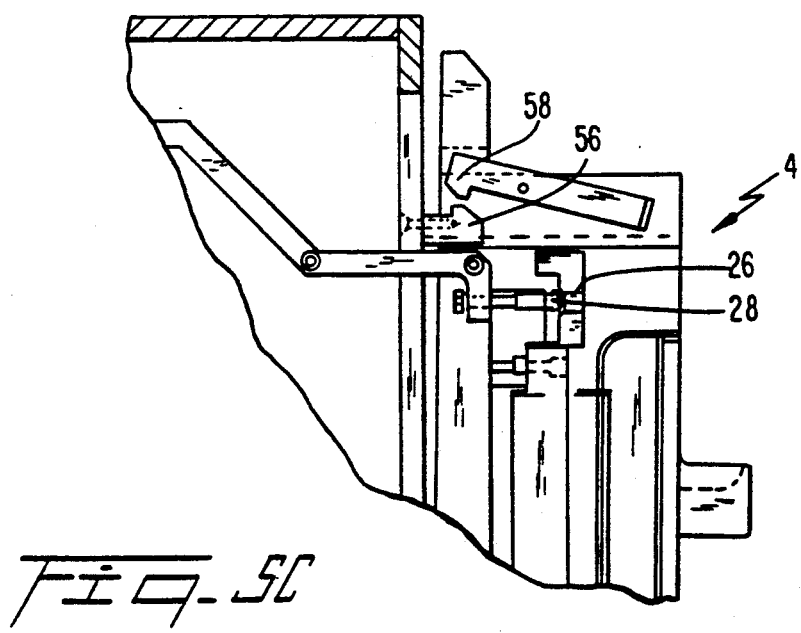
FIG. 5C is a partial left sectional view of the equipment cabinet of FIG. 1 showing details of the receiver latch mechanism with the receiver partially open.
Figure 50:
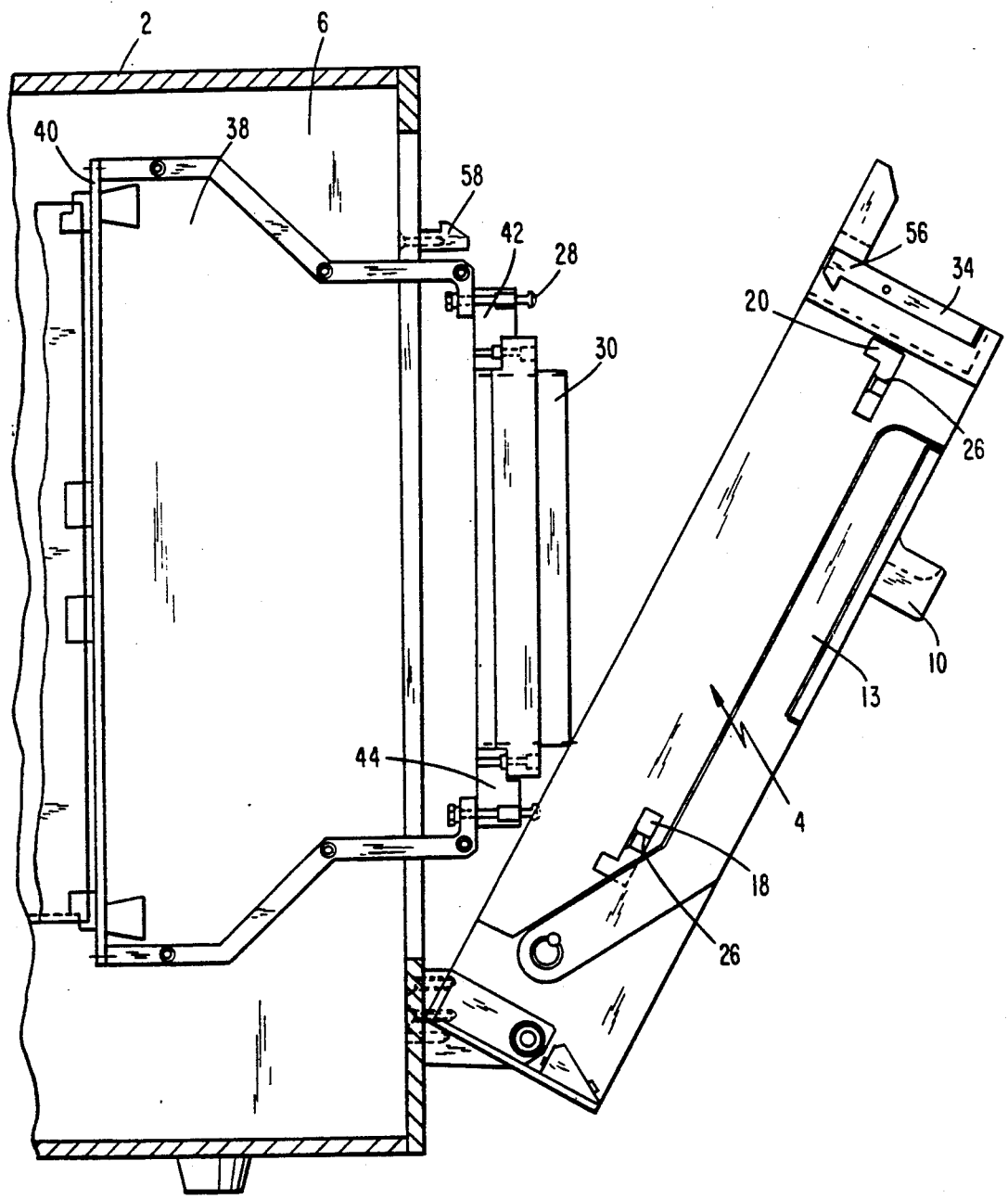

FIGS. 5A through 5D depict the sequence of releasing and lowering hinged receiver 4 into the opened position. Latch release buttons 34 located at the ends of receiver 4 are biased to maintain latch 56 engaged with latch catch 58. In the closed position shown in FIG. 5A alignment pins 28 extend into alignment holes 26. Depressing latch release button 34 disengages latch 56 from latch catch 58 (FIG. 5B) so that interlocking receiver 4 can be rotated away from card cage 6, withdrawing alignment pins 28 from alignment holes 26 (FIGS. 5C and 5D).

When interlocking receiver 4 is fully lowered into the open position as shown in FIG. 6, instrumentation card 8 is accessible for removal from card cage 6 along rails 32 and 34. Mother board 52 provides electrical interface between the instrumentation cards. A power supply 53 is conventionally installed in the equipment cabinet to provide power to the instrumentation cards via the mother board. FIG. 7 depicts top and bottom bars 18 and 20 of the inner frame assembly including alignment holes 26 evenly spaced along the bars. The alignment holes are preferably chamfered as shown in FIG. 11 so that alignment pins 28 are guided into the hole. A horizontal locator 22 is attached to bottom bar 20 to provide lateral alignment of the ITA.

Figure 10:
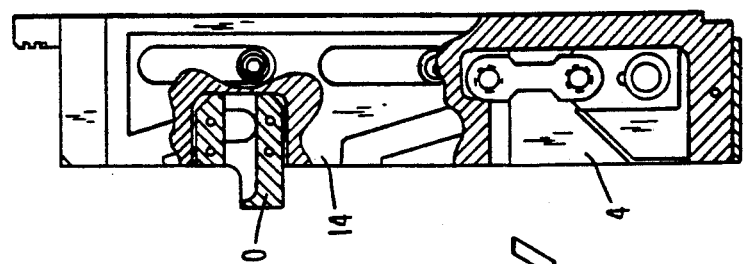
FIG. 10 is an inner view of the right side of the receiver showing a vertical hanger in the open position to accept an ITA.
Figure 8:
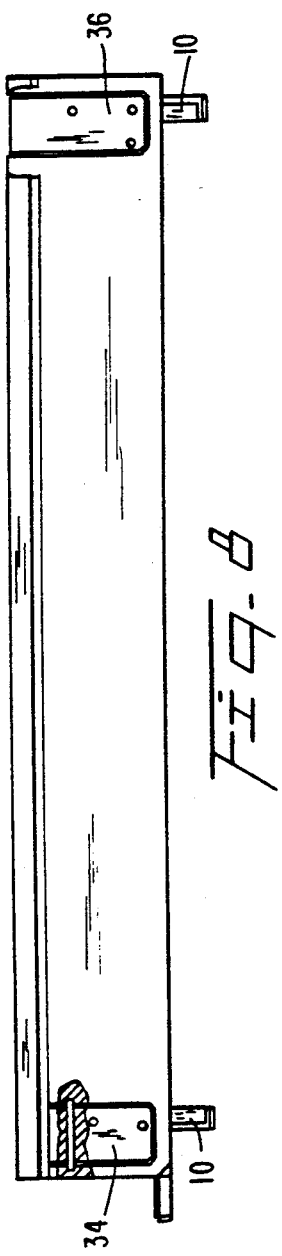
FIG. 8 is a top view of the receiver mechanism showing the receiver latch release buttons.
Figure 9:
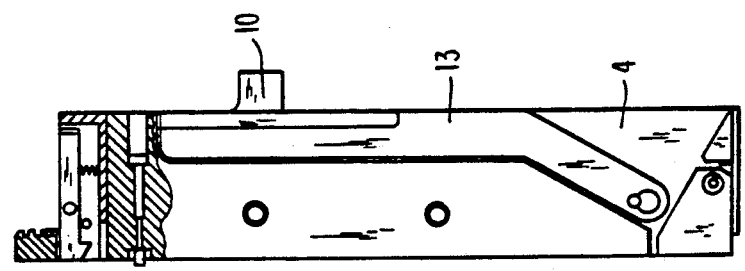
FIG. 9 is a left side view of the receiver showing the handle for engaging, positioning, and releasing an interchangeable test adapter (ITA).

Top and side views of the interlocking receiver are shown in FIGS. 8-10. FIG. 10 depicts vertical hanger 10 which receives and guides vertical rollers/locators 11 located on either end of an Interchangeable Test Adapter (ITA) into the grooves of left slide 14. Raising handle 13 engages rollers 11 of the ITA into the grooves of the slide pieces, pulling the ITA toward the receiver so that connectors in the ITA engage corresponding connector modules extending into the void between top and bottom bars 18 and 20 of the receiver inner frame assembly.

Details of the interconnect adapter without a connector module installed are shown in FIGS. 12-14C. Adapter top and bottom walls 60 and 62 are made of aluminum to provide electrical shielding and provide mechanical support for the connector module. Bolts can be used to attach a connector module to blocks 42 and 44 using mounting holes 63. Aluminum covers 64 are attached to either side of the interconnect adapter to provide electrical shielding between adjacent adapters and to provide additional structural integrity. Upper and lower pin mounting blocks 42 and 44 include alignment pins 28 and a stepped portion on and between which a suitable connector module is mounted.

The interconnect adapter can be mounted to the front panel of an instrumentation card without modification by using mounting adapter 65. Referring to FIGS. 13 and 14, a central mounting hole 66 of mounting adapter 65 includes a grommet 68 for engaging a standard mounting hole in the front panel 40 of the instrumentation panel. Threaded holes 70 are provided in the mounting adapter on both sides of central mounting hole 66. Screws 72 are inserted into holes 74 of adapter top and bottom walls 60 and 62 and engage threaded holes 70 of the mounting adapter, securing the mounting adapter to the interconnect adapter. A standard panel mounting screw 73 is inserted into hole 66 of the mounting adapter to engage a corresponding card mounting hole of the card cage.

Figure 17:
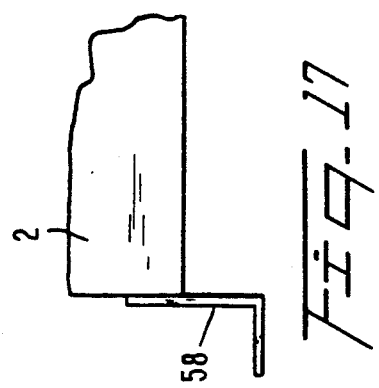
FIG. 17 is a top view of the rack mount adapter attached to the equipment cabinet.
Figure 16:
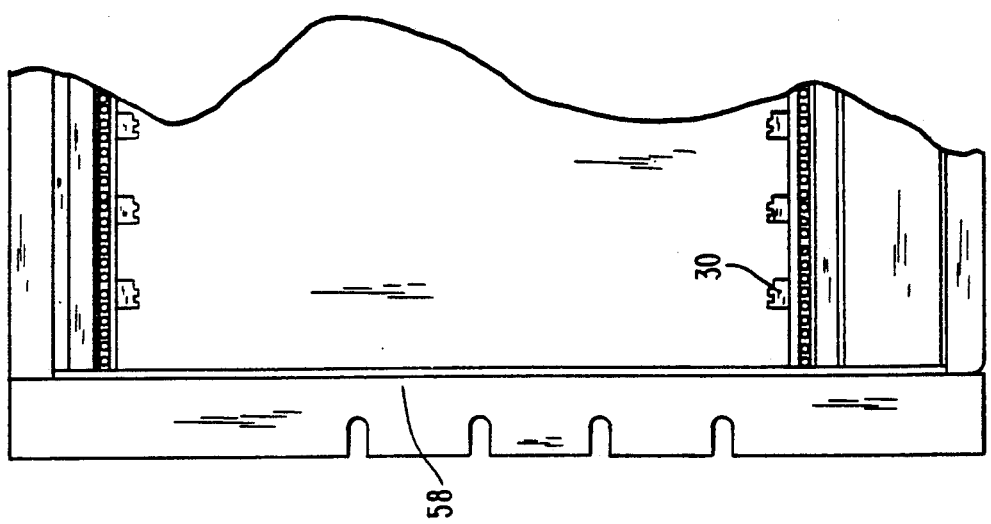
FIG. 16 is a front view of the equipment cabinet of FIG. 1 with receiver removed.
Figure 15:
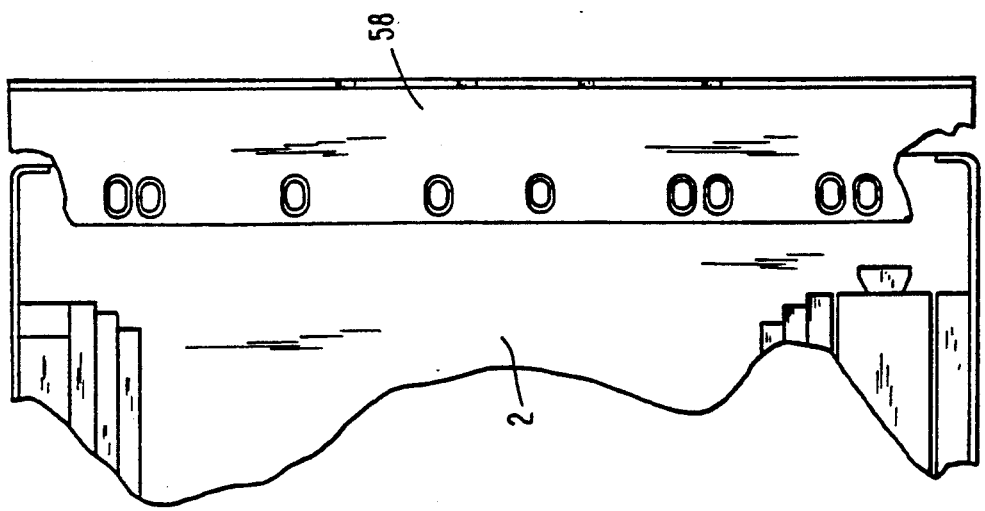
FIG. 15 is a left side view of the equipment cabinet of FIG. 1 including a rack mount adapter.

Although the dimensions of the instrumentation cards and interconnect adapter are standardized so that the overall depth of the instrumentation card with interconnect adapter is fixed, the overall depth of commercially available card cages vary among manufacturers. To accommodate different card cage dimensions, rack mounting adapters 58 as shown in FIGS. 15-17 are positioned on both sides of the card cage so that interlocking receiver 4 properly engages the interconnect adapters. Thus, a standardized interface adapter is used with card cages of different manufacturers by adjusting the rack mount adapters to accommodate variations in cage depth.

Figure 22:
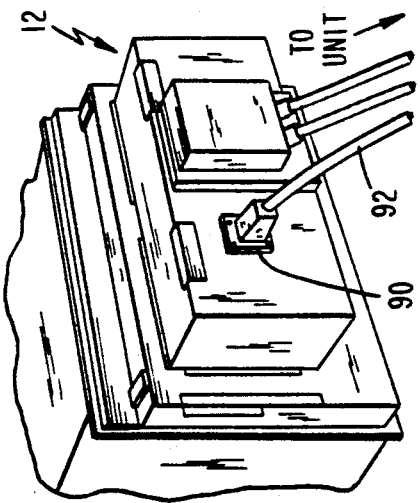
FIG. 22 is a front view of a an ITA configured for system fixturing of a UUT.
Figure 21:
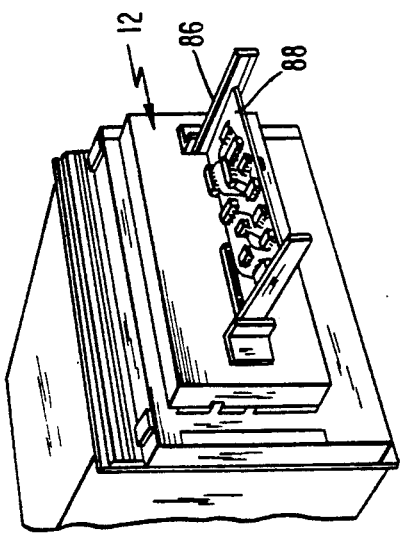
FIG. 21 is a front view of a an ITA configured for functional fixturing of a UUT.
Figure 20:
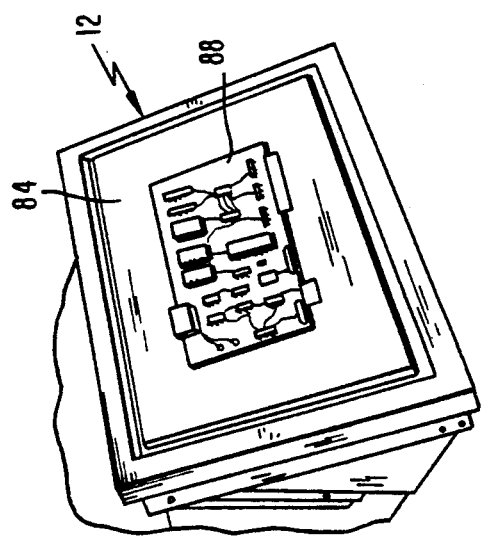
FIG. 20 is a front view of a an ITA configured for vacuum fixturing of a unit under test (UUT).

A generalized Interchangeable Test Adapter (ITA) is shown in FIGS. 18 and 19. Connectors 78 are secured between top and bottom bars 80 and 82 in alignment with corresponding ones of the interconnect adapters. Connectors 78 are positioned to engage opposed connector modules when the ITA is engaged onto the receiver using handle 13. The ITA includes jumpers for configuring the instrumentation modules as required for a particular application and can provide various fixturing. As shown in FIGS. 20-21, the ITA can include, for example, a vacuum fixture and bed of nails 84 or an edge connector fixture 86 connected to the various instrumentation cards for exercising a UUT circuit board 88. Alternatively, as shown in FIG. 22, the ITA can be configured to provide connectors 90 and cables 92 suitable for connecting the testing system to a particular UUT system to be tested. Because ITAs are quickly and easily changed, various testing configurations can be implemented without rewiring or changing multiple individual connectors to the instrumentation cards.

To facilitate mounting of an interconnect adapter onto the front panel of an instrumentation card, the adapter can include a connector mounting plate. Appropriate connectors are mounted in the connector mounting plate and positioned to engage corresponding connectors on the instrumentation panel when the interconnect adapter is mounted onto the instrumentation card.

Figure 23:
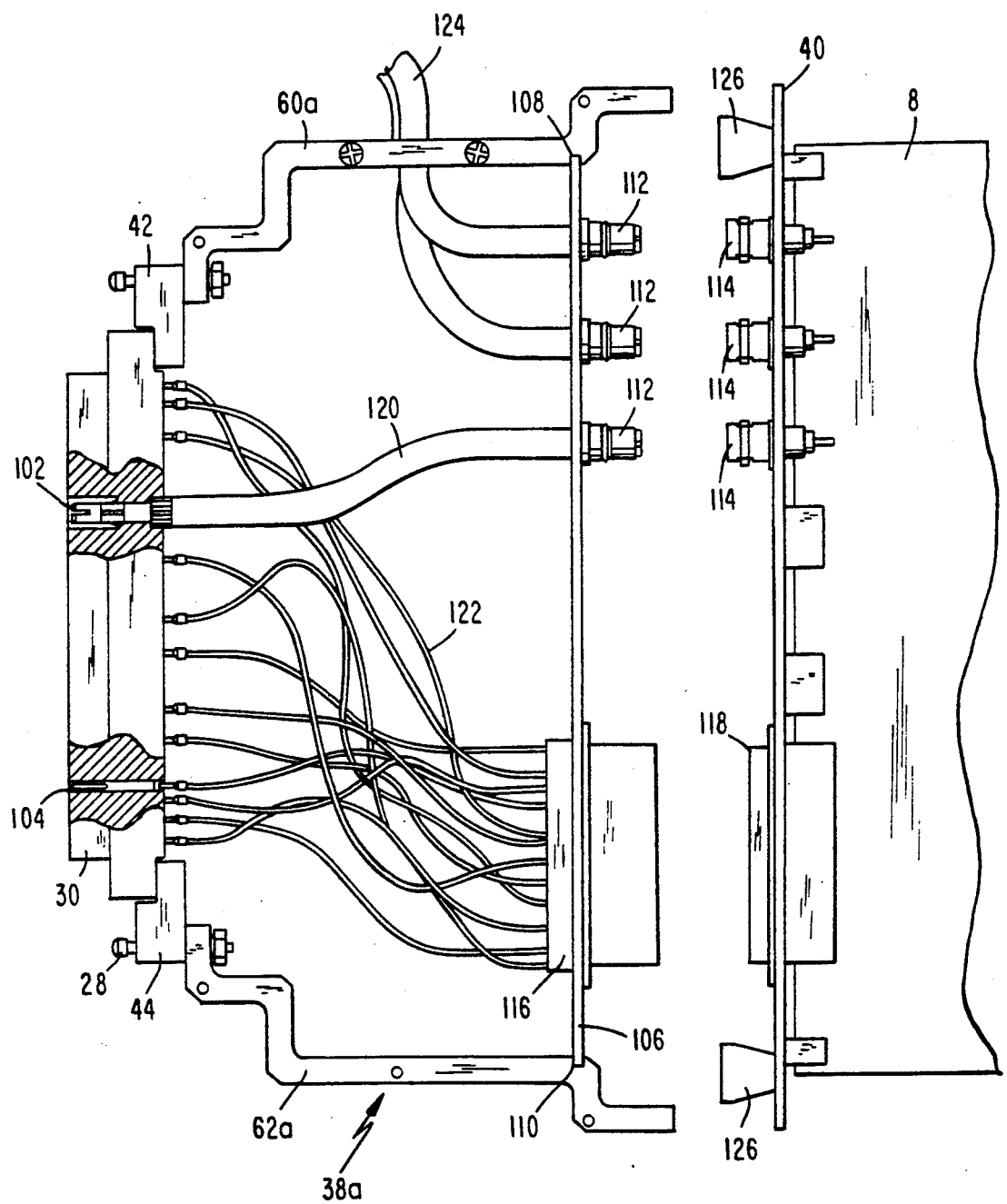
FIG. 23 is a side view of an ITA. with an internal panel having connectors mounted therein and positioned to be mated onto the front panel of an instrumentation card.

Referring to FIG. 23, interconnect adapter 38a includes top and bottom walls 60a and 62b conventionally made of die cast aluminum. The walls are symmetrically opposed to form an opening at one end for mounting connector module 30. Interconnect adapter 38a is mounted opposite connector module 30 onto opposite ends of the front of the instrumentation card the front panel 40. Mounting blocks 42 and 44 are attached to the outside of the connector module ends of top and bottom walls 60a and 62a. The blocks are conventionally made of an insulating material such plastic, to avoid grounding of any of the module terminals. Connector module 30 is mounted on the mounting blocks facing outward from interconnect adapter 38a in the connector module opening. Various connector types and configurations can be included in connector module 30 including radio frequency (RF) connectors 102 and low level signal connectors 104.

A connector mounting plate 106 is mounted in slots 108 and 110 formed in the inner surfaces of top and bottom walls 60a and 62a. Connectors corresponding to the connector types, locations and configurations on front panel 40 of instrumentation card 8 are mounted in connector mounting plate 106. The connector configuration shown in FIG. 23 is by way of example with male RF connectors mounted on mounting plate 106 positioned to engage front panel mounted female RF connectors 114 of instrumentation card 8. Similarly, male D-shell connector 116 is positioned on mounting plate 106 to engage front panel female D-shell connector 118. Cables 120 and 122 run between connectors 102 and 104 of connector module 30 and connectors 112 and 114. Intermodule connection cables 124 provide direct electrical connections instrumentation modules without going through connector module 30.

Slots 108 and 110 are set back from the instrumentation card ends of side walls 60a and 60b so that connector plate 108 is recessed into interconnect adapter 38a. Mounting plate 106 is positioned to provide nominal lateral spacing between connectors 112 and 114 and between connectors 116 and 118 to permit proper engagement thereof when interconnect module 38a is mounted on front panel 40.

The instrumentation card ends of side walls 60a and 60b contact opposite ends of front panel 40 outside of instrumentation card handles 126 to provide mechanical mounting stability for the interface module. Depending on the types and configuration of connectors 112, 114, 116 and 118, interface module 38a may be adequately attached onto front panel 40; the instrumentation card ends of side walls 60a and 62a provide additional mounting support and reduce mechanical strain on the connectors. If the connectors alone do not provide adequate mounting support for interface adapter 38a or if the connectors would be subjected to excessive strain, then mounting screws or other similar type fasteners can be used to securely attach the adapter to front panel 40.

Figure 24:
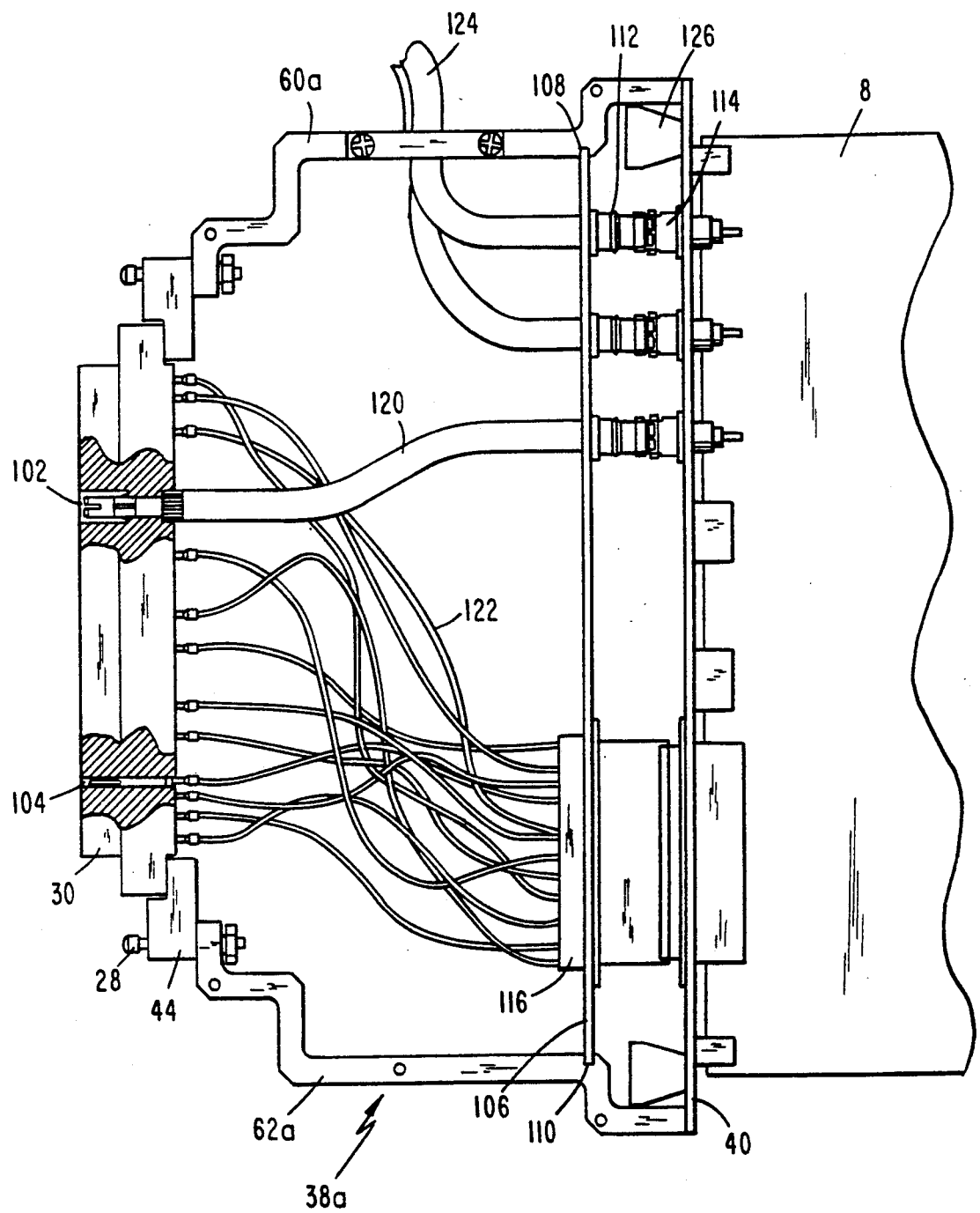
FIG. 24 is a side view of the ITA of FIG. 23 shown mounted on the front panel of an instrumentation card.

Referring to FIG. 24, the spacing between connector mounting plate 106 and front panel 40 provides optimal mating of connectors 112 to connectors 114 and connector 116 to connector 118 with interconnect adapter 38a mounted on instrumentation card 8. Connector mounting plate 106 must be set back to accommodate the connector type protruding the greatest distance out from the panel. Smaller connectors extending out from the panel lesser distances themselves are extended to provide nominal mating with corresponding instrumentation card front panel connectors.

Figure 25:
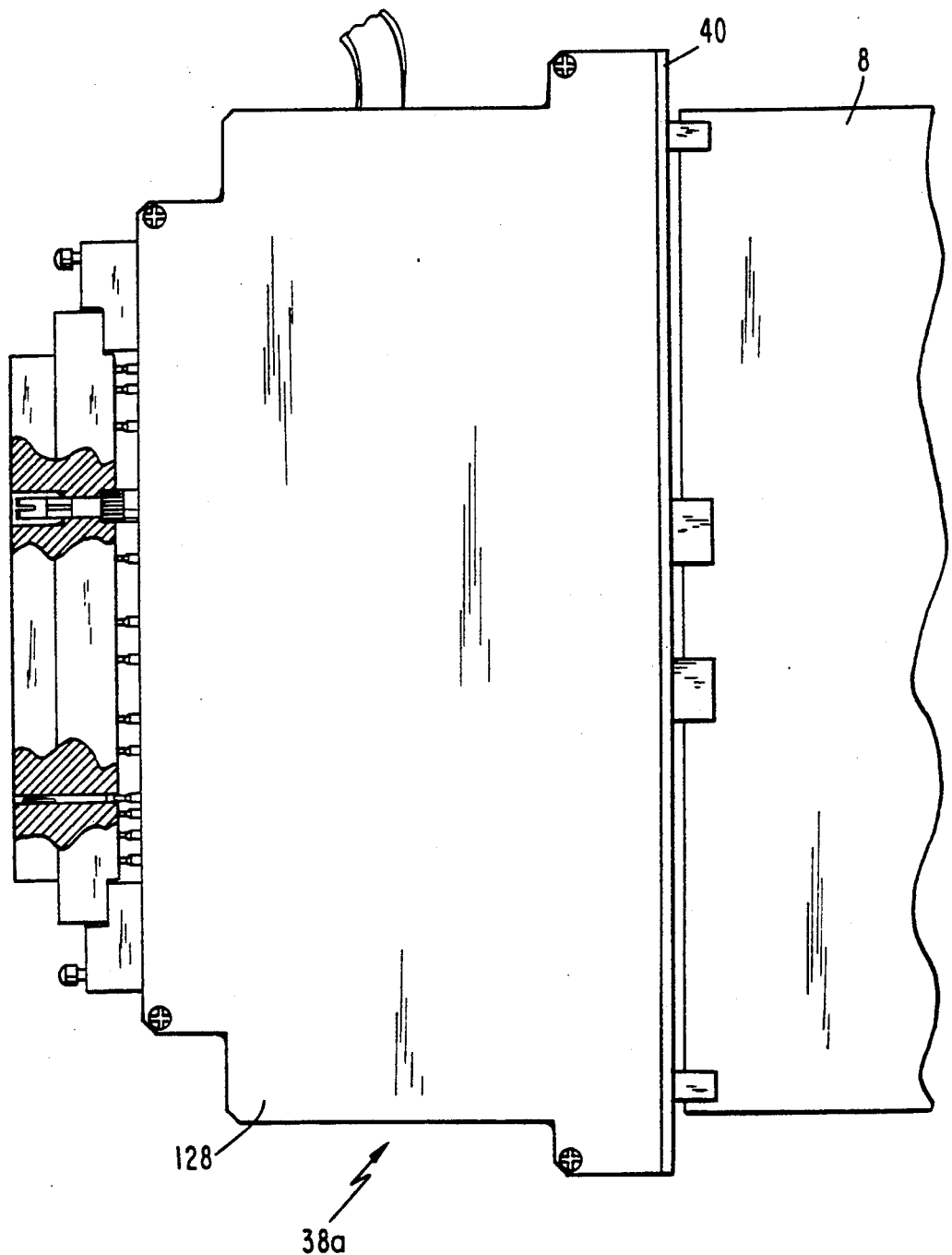
FIG. 25 is a side view of the ITA of FIG. 23 with side panels in place and mounted on the front panel of an instrumentation card.

The interconnect adapter mounted onto the front panel of instrumentation card 8 is shown in FIG. 25. Side panels 128 provide additional mechanical strength and electrical shielding.

Figure 26:
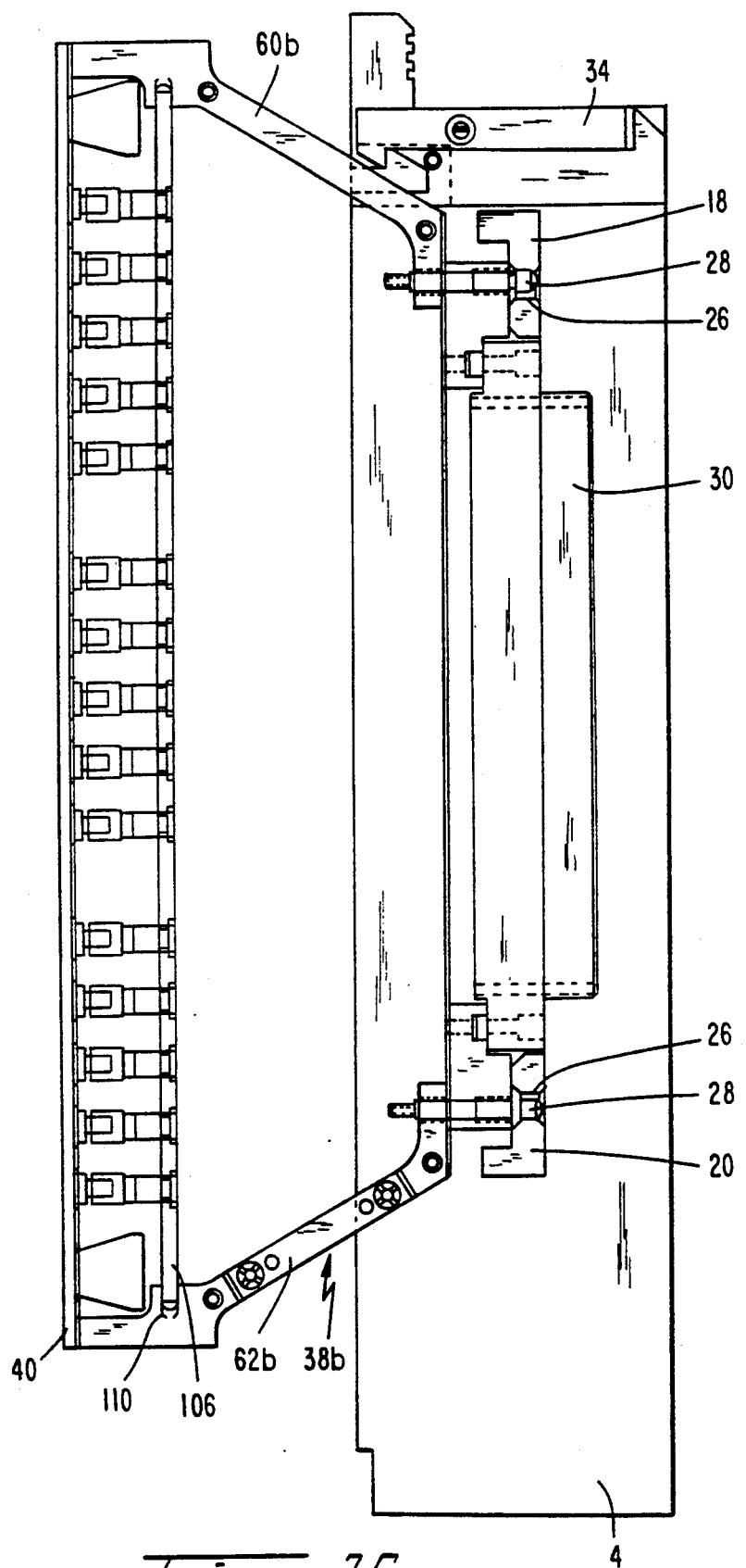
FIG. 26 is a side view of an interconnect adapter with an internal connector mounting plate with connectors mounted therein with the interconnect adapter engaging the inner frame assembly of a receiver.

Another connector configuration is shown in FIG. 26. In contrast to the angular walls of the interconnect adapter shown in FIGS. 23-25, top and bottom walls 60b and 62b of interconnect adapter 38b provide a continuous taper. Connector module 30 is accessible through receiver 4 when the receiver is in the upright closed position. Alignment pins 28 are engaged by alignment holes 26 of top and bottom bars 18 and 20 when the receiver is closed to accurately position connector module 30.

An alternate method of mounting an interconnect adapter to the front panel of an instrumentation card is shown in FIG. 27. In FIG. 27 interconnect adapter 38b is mounted on front panel 40 of a type VXI instrumentation card with the interconnect adapter shown in partial phantom to reveal front panel 40; the interconnect module is omitted for clarity.

Standard VXI instrumentation cards include front panels with a nominal width of 1.188 inches to accomodate a nominal spacing between card centers of 1.2 inches. The cards are located between imaginary intermodule separation planes spaced every 1.2 inches. Each instrumentation card includes a pair of mounting holes spaced 0.1 inch on either side of the center of front panel 40 at the top and bottom of the panel. The mounting holes are aligned over corresponding card cage mounting holes, each accepting a mounting screw for securing the circuit card front panel to the card cage.

Referring to FIG. 27, mounting holes 130 and 132 are located on opposite sides of the center line of interconnect adapter 38b in top and bottom walls 60a and 62b. The mounting holes aligned with corresponding mounting holes of a standard instrumentation card. As shown in FIG. 28, mounting hole 132 includes a neck portion 134 for engaging the head of a mounting screw 136, thereby securing the interconnect adapter and the underlying instrumentation card front panel to a card cage. Hole 130, shown in cross-sectional view in FIG. 29, does not include any portion for engaging a mounting screw 138, allowing the head of the screw to pass through the hole and engage only the exposed portion of the underlying instrumentation card front panel. Mounting hole 130 provides access to mounting screw 138 for mounting and removal of the instrumentation card without removal of the associated interconnect adapter, and provides a recess for the head of screw 138 to permit flush mounting of the interconnect adapter to front panel 40.

In this disclosure, there is shown and described only the preferred embodiment of the invention, but, as aforementioned, it is to be understood that the invention is capable of use in various other combinations and environments and is capable of changes or modifications within the scope of the inventive concept as expressed herein. For example, while instrumentation cards are shown, any electronic circuit card including processing cards and power supply modules can be adapted to accept interconnect modules for interfacing with an interconnect adapter. Further, while the invention is shown in the testing environment, it is equally adapted to other types of systems including but not limited to reconfigurable data processing equipment, and communications modules.

We claim:

1. A housing for electrical equipment modules, comprising:
   a mainframe housing including a card cage having engagement means for supporting a plurality of said electrical equipment modules at top and bottom sides thereof whereby said electrical equipment modules are to be positioned juxtaposed and in parallel;
   a plurality of interconnect adapters each receiving at a first end thereof a connector end of a respective one of said electrical equipment modules and providing at a second end an electrical connector for connecting said respective module to an external electrical fixture at the front end of said mainframe housing, said second end including a pair of pins located at top and bottom ends of said respective adapter on either side of said connector; and
   a hinged receiver positioned on said front of said mainframe housing in a vertical operational position and in a horizontal module access position, said receiver including means for securing said external electrical fixture thereto on a side opposite said interconnect adapters, said receiver having a plurality of apertures on an adapter side of said receiver, each removeably receiving a respective one of said pins with said hinged receiver in said vertical position, whereby said interconnect adapters are aligned by said pins and whereby said external electrical fixture is brought into electrical contact with said plurality of interconnect adapters, said receiver permitting insertion and removal of said electrical equipment modules into and out from said mainframe housing past said receiver with said receiver in said horizontal access position.

2. The housing for electrical equipment modules as recited in claim 1 wherein said means for securing said external electrical fixture to said receiver includes a hanger for vertically positioning said external electrical fixture and closure means for horizontally transporting said external electrical fixture toward and away from said interconnect adapters.

3. The housing for electrical equipment modules as recited in claim 1 wherein said electrical equipment modules each include a front panel having mounting holes located proximate the top and bottom edges thereof and said mainframe housing includes a plurality of frame mounting holes for securing said electrical equipment modules in said housing, said housing further comprising mounting adapter having a body with a central void for receiving a bolt adapted to pass through one of said front panel mounting holes into one of said frame mounting holes for securing said mounting adapter and said electrical equipment modules to said housing, said mounting adapter having lateral voids flanking said central void for securing an interconnect adapter to said electrical equipment modules.

4. The housing for electrical equipment modules as recited in claim 1, said interconnect adapters further comprising electrical connectors at said first ends for receiving a mating connector at said connector ends of said equipment modules.

5. The housing for electrical equipment modules as recited in claim 1, said interconnect adapters further comprising recessed walls having auxiliary connectors mounted therein for receiving external connectors thereat.

6. A system for housing circuit boards, comprising:
   a circuit card including a front panel having an electrical connector mounted therein;
   an interconnect adapter mounted on said circuit card including attachment means mounting a rear end thereof onto the front panel of the circuit card and a connector module mounted on a front end of the interconnect adapter, said connector module electrically connected through said interconnect adapter to the electrical connector of said circuit card for providing an electrical interface between the circuit card and external equipment; and
   a card cage including a receiver mounted on the front of the card cage having a module access space into which the connector module extends with the receiver in a closed position for providing an external connection to said connector module.

7. The system for housing circuit boards as recited in claim 6, further comprising positioning means provided on the front end of the interconnect adapter and wherein said receiver includes alignment means which engage the positioning means of the interconnect adapter for aligning the connector module to said receiver.

8. The system for housing circuit boards as recited in claim 7 wherein said positioning means comprises a pair of alignment pins located at the top and bottom of the interconnect adapter on either side of the connector module.

9. The system for housing circuit boards as recited in claim 8 wherein said alignment means comprises a plurality of chamfered apertures in an inner frame portion of the receiver for engaging said alignment pins.

10. The system for housing circuit boards as recited in claim 9 wherein said receiver is hinged onto the card cage so that it can be positioned in an open position for removing and inserting the circuit card into the card cage and in said closed position wherein the apertures engage the alignment pins of the interconnect adapter thereby positioning the connector module into a predetermined interconnect position.

11. The system for housing circuits boards as recited in claim 6 wherein said attachment means includes a mounting adapter having a main body having a width equal to or less than the width of the front panel of said circuit card, said main body having
   a central void for accepting a bolt engaging a card mounting rail of the card cage, said bolt passing through a mounting hole in the front panel of the circuit card to engage the card mounting rail so that the front panel of the circuit card is secured to the card mounting rail, and
   threaded voids located on opposite sides of the central void in said mounting adapter body receiving bolts attaching the rear end of the interconnect adapter to the mounting adapter.

12. The system for housing circuit boards as recited in claim 6 including an interchangeable test adapter (ITA) mountable on the receiver substantially covering the module access space in the receiver, said ITA having one or more connectors facing outward from one side thereof for engaging said connector module.

13. The system for housing circuit boards as recited in claim 12 wherein said receiver includes hangers for supporting and positioning the ITA so that the ITA connector operatively engages the module connector.

14. The system for housing circuit boards as recited in claim 6, said interconnect adapter further comprising an electrical connector at said rear end for engaging said electrical connector of said circuit card.

15. The system for housing circuit boards as recited in claim 6, said interconnect adapter further comprising an electrical connector mounted in a secondary wall recessed from said front end and having mounted therein an auxiliary connector for receiving an external connector.

16. An equipment module comprising:
a circuit card including a front panel and a front panel connector mounted therein; and
an interconnect adapter including
 (i) attachment means for mounting a rear end of said interconnect adapter to said front panel of said circuit card,
 (ii) a rear connector engaging said front panel connector of said circuit card,
 (iii) a connector module mounted on a front end of the interconnect adapter, said connector module electrically connected to said front panel connector of said circuit card through said rear connector of said interconnect adapter for providing an electrical interface between the circuit card and said external device, and
 a pair of alignment pins located on the front end of said interconnect adapter on opposite sides of said connector module.

17. The equipment module as recited in claim 16, wherein said alignment pins are located along a major axis of said connector module.

18. The equipment module as recited in claim 16, wherein said interconnect adapter further includes an adapter housing comprising:
top and bottom walls having outer surfaces spaced apart at a rear end of said adapter housing by a distance substantially equal to a distance between opposite minor edges of said front panel of said circuit card;
means for attaching opposite ends of said connector module to said top and bottom walls for mounting said connector module on a front end of said adapter housing;
a pair of spaced apart parallel, planar side walls extending from the rear and to the front end of said adapter housing, joining said top and bottom walls, outer surfaces of said side walls spaced apart by a distance substantially equal to opposite major edges of said front panel of said circuit card.

19. The equipment module as recited in claim 16, further comprising a connector mounted on said rear end for engaging a mating connector mounted in a front panel of said circuit card.

20. An equipment module comprising:
a circuit card including a front panel with a connector mounted therein; and
an interconnect adapter for connecting said circuit card to an external device, said interconnect adapter including
 (i) attachment means for mounting a rear end of said interconnect adapter to an end of said circuit card,
 (ii) a connector module mounted on a front end of the interconnect adapter, said connector module electrically connected to said circuit card for providing an electrical interface between the circuit card and said external device through said interconnect adapter,
 (iii) a pair of alignment pins located on the front end of said interconnect adapter on opposite side of said connector module,
 (iv) top and bottom walls having outer surfaces spaced apart at a rear end of said adapter housing by a distance substantially equal to a distance between opposite minor edges of said front panel of said circuit card,
 (v) means attaching opposite ends of said connector module to said top and bottom walls for mounting said connector module on a front end of said adapter housing,
 (vi) a pair of spaced apart parallel, planar side walls extending from the rear and to the front end of said adapter housing, joining said top and bottom walls, outer surfaces of said side walls spaced apart by a distance substantially equal to opposite major edges of said front panel of said circuit card, and
 (vii) two pairs of mounting holes located in said top and bottom walls, respectively, each of said pairs of mounting holes including (i) a first hole having a substantially uniform diameter for receiving a first mounting screw without engagement thereof and (ii) a second mounting hole having a neck portion for engaging a head of a second screw.

21. The interconnect adapter as cited in claim 20, wherein said alignment pins are located along a major axis of said connector module.

22. The interconnect adapter as cited in claim 20, further comprising an auxiliary connector mounted in said top wall for engaging an external connector.

23. The interconnect adapter as recited in claim 20, wherein said adapter include means for attachment thereof to said front panel of said circuit card.

24. An interconnect adapter mounted on a circuit card for connecting the circuit card to an external device, the circuit card including a front panel with an electrical connector mounted therein, said interconnect adapter comprising:
an adapter housing having a rear end positioned over said front panel of said circuit card and a front end opposite said rear end;
a connector panel mounted in said adapter housing spaced apart from said rear end of said adapter housing;
a rear connector mounted in said connector panel engaging the connector of said front panel of said circuit card;
a connector module mounted on said front end of the interconnect adapter; and
means electrically connecting said rear connector to said connector module.

25. The interconnect adapter as recited in claim 24, further comprising a pair of alignment pins located on the front end of said interconnect adapter on opposite sides of said connector module.

26. The interconnect adapter as recited in claim 25, wherein said alignment pins are located along a major axis of said connector module.

27. The interconnect adapter as recited in claim 24, further comprising attachment means for mounting said rear end of said interconnect adapter to said front panel of said circuit card.

28. An equipment module mountable on a circuit card for connecting the circuit card to an external device, the circuit card including a front panel with an electrical connector mounted therein, said interconnect adapter comprising:
- an adapter housing having a rear end positionable over said front panel of said circuit card and a front end opposite said rear end;
- a connector panel mounted in said adapter housing spaced apart from said rear end of said adapter housing;
- a rear connector mounted in said connector panel and positioned to engage the connector of said front panel of said circuit card with said adapter mounted on the circuit card front panel;
- a connector module mounted on said front end of the interconnect adapter;
- means for electrically connecting said rear connector to said connector module,
- said adapter housing comprising
  - (i) top and bottom walls having outer surfaces spaced apart at said rear end of said adapter housing by a distance substantially equal to a distance between opposite minor edges of said front panel of said circuit card,
  - (ii) means for attaching opposite ends of said connector module to said top and bottom walls for mounting said connector module on said front end of said adapter housing, and
  - (iii) a pair of spaced apart parallel, planar side walls extending from said rear and to said front end of said adapter housing, joining said top and bottom walls, outer surfaces of said side walls spaced apart by a distance substantially equal to opposite major edges of said front panel of said circuit card.

29. The equipment module as recited in claim 28, further comprising two pairs of mounting holes located in said top and bottom walls, respectively, each of said pairs of mounting holes including (i) a first hole having a substantially uniform diameter for receiving a first mounting screw without engagement thereof and (ii) a second mounting hole having a neck portion for engaging a head of a second screw.

30. The interconnect adapter as recited in claim 28, further comprising a pair of alignment pins located on the front end of said interconnect adapter on opposite sides of said connector module.

31. The interconnect adapter as recited in claim 28, wherein said alignment pins are located along a major axis of said connector module.

32. The interconnect adapter as recited in claim 28, further comprising attachment means for mounting said rear end of said interconnect adapter to said front panel of said circuit card.

33. A cabinet housing circuit boards having respective connector modules attached to external connection ends thereof, said cabinet comprising:
- a card cage including card slots adapted to hold said circuit cards; and
- a receiver hingedly mounted on the front of the card cage and positioned in a closed position securing said circuit cards within said card cage and in an open position releasing said circuit cards for inserting and removing said circuit cards from said card cage, said receiver including top and bottom inner frames with a module access space therebetween, said frames having a plurality of chamfered apertures formed in alignment with said card slots and engaging said circuit cards with said receiver in said closed position.

34. An interconnect adapter and a circuit card in combination with a mounting adapter for securing the interconnect adapter and the circuit card to a card mounting rail of a card cage, said interconnect adapter mountable on said circuit card for connecting the circuit card to an external device,
said circuit card including a front panel with an electrical connector mounted therein;
said interconnect adapter including
- (i) an adapter housing having a rear end positioned over said front panel of said circuit card and a front end opposite said rear end,
- (ii) a connector panel mounted in said adapter housing spaced apart from said rear end of said adapter housing,
- (iii) a rear connector mounted in said connector panel and positioned to engage the connector of said front panel of said circuit card with said adapter mounted on the circuit card front panel,
- (iv) a connector module mounted on said front end of the interconnect adapter, and
- (v) means electrically connecting said rear connector to said connector module; said mounting adapter including
  - (i) a main body having a width equal to or less than the width of said front panel of the circuit card, said main body having
    - (a) a central void accepting a bolt engageable with said card mounting rail of the card cage, said bolt passing through a mounting hole in the front panel of the circuit card to engage the card mounting rail so that the front panel of the circuit card is secured to the card mounting rail, and
    - (b) threaded voids located on opposite sides of the central void in said mounting adapter body receiving bolts for attaching the rear end of the interconnect adapter to the mounting adapter; and
  - (ii) clip mean extending through said mounting hole in the front panel of the circuit card securing said mounting adapter body to said front panel.

* * * * *